US010462913B2

(12) United States Patent
Jung et al.

(10) Patent No.: US 10,462,913 B2
(45) Date of Patent: Oct. 29, 2019

(54) ELECTRONIC DEVICE HAVING ENCLOSED WINDOW AND METHOD FOR MANUFACTURING THE SAME

(71) Applicant: Samsung Electronics Co., Ltd., Suwon-si, Gyeonggi-do (KR)

(72) Inventors: Min Su Jung, Seoul (KR); Yong Seok Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 15/494,859

(22) Filed: Apr. 24, 2017

(65) Prior Publication Data

US 2017/0318690 A1 Nov. 2, 2017

(30) Foreign Application Priority Data

May 2, 2016 (KR) .................. 10-2016-0053779

(51) Int. Cl.
*H05K 7/02* (2006.01)
*H05K 7/04* (2006.01)
*H05K 5/00* (2006.01)
*B29C 65/48* (2006.01)
*B29C 65/00* (2006.01)
*H05K 1/02* (2006.01)
*H05K 1/18* (2006.01)
*H05K 5/02* (2006.01)
*H05K 5/03* (2006.01)
*G06F 1/16* (2006.01)
*H04M 1/02* (2006.01)

(52) U.S. Cl.
CPC ....... *H05K 5/0017* (2013.01); *B29C 65/4845* (2013.01); *B29C 65/4855* (2013.01); *B29C 66/72* (2013.01); *G06F 1/16* (2013.01); *H04M 1/0266* (2013.01); *H05K 1/028* (2013.01); *H05K 1/189* (2013.01); *H05K 5/0008* (2013.01); *H05K 5/0217* (2013.01); *H05K 5/03* (2013.01); *H05K 2201/056* (2013.01); *H05K 2201/10128* (2013.01)

(58) Field of Classification Search
CPC ... B29C 65/4845; B29C 65/4855; G06F 1/11; H05K 1/0266; H05K 1/028; H05K 1/189; H05K 5/0017; H05K 5/0008; H05K 5/0217; H05K 5/03; H04M 1/0266
USPC ....................... 361/807, 809, 810
See application file for complete search history.

(56) References Cited

U.S. PATENT DOCUMENTS

| | | | |
|---|---|---|---|
| 5,642,255 A | 6/1997 | Suzuki et al. | |
| 7,515,431 B1 | 4/2009 | Zadesky et al. | |
| 8,385,060 B2 * | 2/2013 | Dabov | G06F 1/1626 29/832 |
| 8,532,480 B2 * | 9/2013 | Hietala | B29C 45/4421 396/535 |

(Continued)

*Primary Examiner* — Hung S. Bui
(74) *Attorney, Agent, or Firm* — Jefferson IP Law, LLP

(57) ABSTRACT

A method for manufacturing an electronic device and the electronic device therefor are provided. The electronic device includes a substantially enclosed window including a front surface, a rear surface and a side surface surrounding at least a portion of a space between the front surface and the rear surface, a display disposed inside the window, and a display bracket, to which the display is coupled and disposed inside the window. The display is coupled to the window by curing a bonding member inserted between the window and the display.

13 Claims, 29 Drawing Sheets

(56) References Cited

U.S. PATENT DOCUMENTS

| | | | |
|---|---|---|---|
| 9,367,095 B2* | 6/2016 | Myers | G06F 1/1626 |
| 9,429,997 B2 | 8/2016 | Myers et al. | |
| 9,838,518 B2* | 12/2017 | Lei | G06F 1/1652 |
| 9,989,995 B2* | 6/2018 | Kwak | G06F 1/1626 |
| 10,129,989 B2* | 11/2018 | Kim | G06F 1/1656 |
| 2009/0270142 A1* | 10/2009 | Liang | G06F 1/1626 |
| | | | 455/575.1 |
| 2011/0051360 A1 | 3/2011 | Dabov et al. | |
| 2013/0328792 A1 | 12/2013 | Myers et al. | |
| 2014/0168090 A1* | 6/2014 | Aaltonen | G06F 1/1601 |
| | | | 345/173 |
| 2014/0211417 A1 | 7/2014 | Zadesky et al. | |
| 2015/0160699 A1* | 6/2015 | Choi | G06F 1/1643 |
| | | | 345/173 |

* cited by examiner

<1201>

<1203>

ELECTRONIC DEVICE HAVING ENCLOSED WINDOW AND METHOD FOR MANUFACTURING THE SAME

CROSS-REFERENCE TO RELATED APPLICATION(S)

This application claims the benefit under 35 U.S.C. § 119(a) of a Korean patent application filed on May 2, 2016 in the Korean Intellectual Property Office and assigned Serial number 10-2016-0053779, the entire disclosure of which is hereby incorporated by reference.

TECHNICAL FIELD

The present disclosure relates to an electronic device including an enclosed window and a method for manufacturing the same.

BACKGROUND

In recent years, in an electronic device such as a smartphone, a display may be disposed on a side surface or a rear surface as well as a front surface of the electronic device to provide various contents. For example, in the electronic device including a plurality of displays, one display may be disposed on the front surface of the electronic device and another display may be disposed on the side surface or the rear surface of the electronic device. Further, the display disposed on the front surface of the electronic device may extend to the side surface of the electronic device.

The electronic device may include a window as an external protective layer for protecting the display from an external impact. The window generally has a substantially rectangular parallelepiped shape, but may have an enclosed shape (e.g., a cylindrical shape) to improve a grip feeling or an external appearance when the electronic device is gripped.

When the window is of an enclosed type, the display may be pressed from an inside towards an outside of the window to be attached after the display is inserted into a cavity formed inside the window.

However, according to the method of attaching the display to the inside of the window through pressing, the display may come out due to the uneven contact surface.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a manufacturing method of attaching a display to a display bracket, sliding and assembling the display bracket while a gap is maintained between the display bracket and an inside of an enclosed window, inserting a bonding member into the gap, and coupling the window and the display.

In accordance with an aspect of the present disclosure, an electronic device is provided. The electronic device includes a substantially enclosed window including a front surface, a rear surface, and a side surface surrounding at least a portion of a space between the front surface and the rear surface, a display disposed inside the window, and a display bracket coupled to the display. The display is disposed inside the window. The display is coupled to the window by curing a bonding member inserted between the window and the display.

In accordance with another aspect of the present disclosure, a method for manufacturing an electronic device is provided. The method includes preparing a substantially enclosed window including a front surface, a rear surface, and a side surface surrounding at least a portion of a space between the front surface and the rear surface, coupling a display to a display bracket, inserting the display bracket into the window, filling a bonding member between the display bracket and the window, inserting a hardware bracket into the display bracket, and coupling at least one cover to an upper surface or a lower surface of at least one of the window and the hardware bracket.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
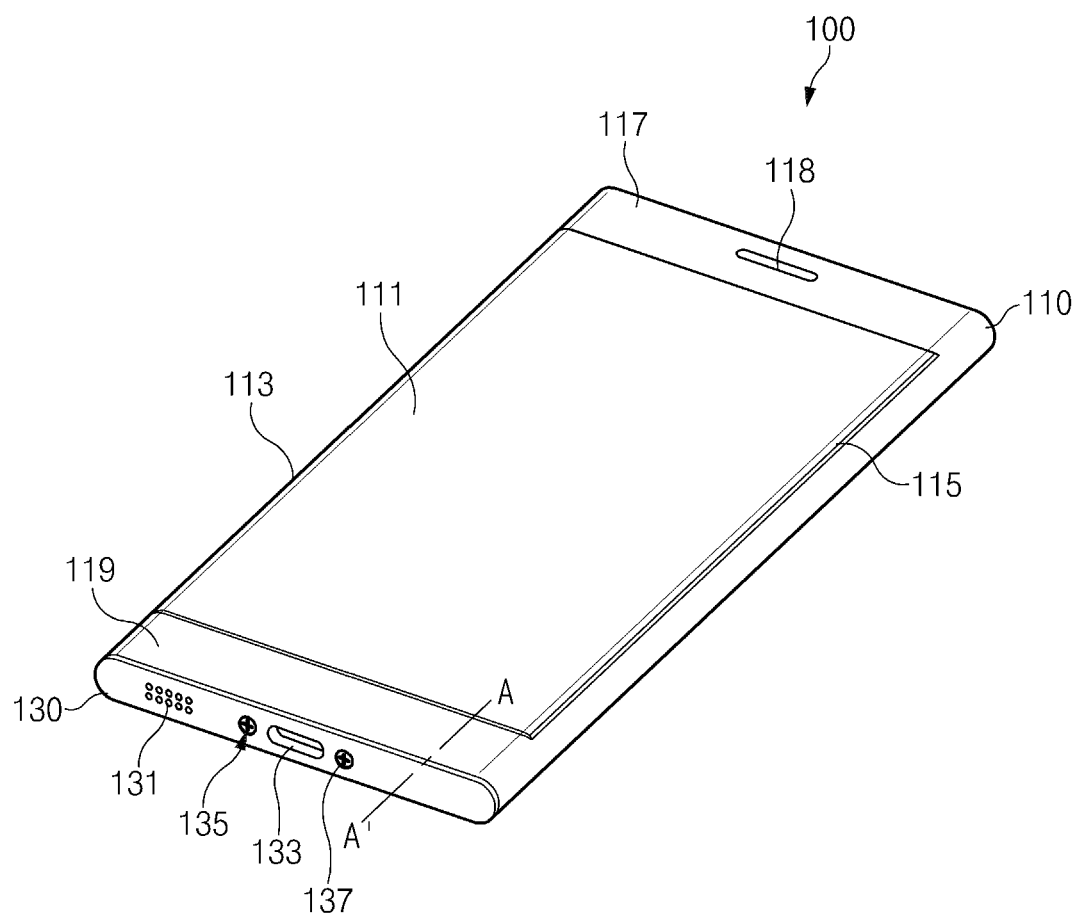
FIG. 1 is a perspective view of an electronic device including an enclosed window according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

All terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Moving Picture Experts Group (MPEG-1 or MPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

FIG. 1 is a perspective view of an electronic device including an enclosed window according to an embodiment of the present disclosure.

Referring to FIG. 1, the electronic device 100 may include a window 110 and a lower end cover 130. The window 110 may protect internal elements (e.g., a display) of the electronic device 100 from an external impact. The window 110 may be substantially of an enclosed type. According to an embodiment, the window 110 includes a front surface and a rear surface, and may include a side surface surrounding at least a portion of a space between the front surface and the rear surface. A section obtained by cutting the side surface in a widthwise direction (e.g., a direction that is perpendicular to line A-A') of the electronic device 100 may have various shapes, such as a circular shape, an elliptical shape, a rectangular shape, or an octagonal shape. Further, the section may be a combination of two or more of the above-mentioned shapes. Although it is preferable that the front surface and the rear surface of the window 110 be substantially planar, at least one of the front surface and the rear surface may be curved in some embodiments.

According to various embodiments, at least a portion of the front surface, the rear surface, and the side surface of the window 110 may be formed of a transparent material (e.g., glass). For example, at least a portion of a front central part 111, a left side surface part 113, and a right side surface part 115 of the window 110 may be formed of a transparent material. As the window 110 includes a transparent material, a display object that is output on a display provided inside the window 110 may be exposed to the outside through an area including the transparent material. As another example, the window 110 may include a bezel area that is adjacent to the glass. The bezel area, for example, may be provided on an upper end part 117 and/or a lower end part 119 of the front surface and/or the rear surface of the window 110. The bezel area may be provided at a portion of the side surface of the window 110. According to an embodiment, at least one opening 118 may be provided in the bezel area, and an internal element (e.g., a speaker, a camera, or a button) provided inside the window 110 may be exposed to the outside through the opening 118.

According to various embodiments, the window 110 may have a hollow therein. For example, an inside of the window 110, which is surrounded by the front surface, the rear surface, and the side surface of the window 110, may correspond to an empty space. As another example, the window 110 may not have at least one of an upper surface and a lower surface, or may include an opening. For example, the window 110 may not have at least one of the upper surface and the lower surface so that an internal element of the electronic device 100 may be inserted into the hollow provided in the window 110 through the upper surface or the lower surface.

According to various embodiments, a cover may be coupled to at least one of the upper side and the lower side of the window 110. The drawing illustrates a state in which the lower end cover 130 is coupled to a lower side of the window 110. Although not illustrated, an upper end cover (not illustrated) may be coupled to an upper side of the window 110. The cover (e.g., the lower end cover 130) may be coupled to at least one of the upper side and the lower side of the window 110 to prevent the hollow provided in the window 110 from being exposed to the outside.

According to various embodiments, the cover (e.g., the lower end cover 130) may include at least one hole. The drawing illustrates a state in which the lower end cover 130 includes a speaker hole 131 (or a microphone hole), an interfacing hole 133, and a screw hole 135. The speaker hole 131 (or the microphone hole) may be a passage through which sound enters or exits. The interfacing hole 133 may be provided such that an external device (e.g., a USB cable) may be inserted into and coupled to an interfacing module (e.g., a USB module) provided inside the window 110. The screw hole 135 may be provided such that the lower end cover 130 may be coupled to the window 110. For example, the screw member 137 may be inserted into the screw hole 135 to fix the lower end cover 130 to the window 110.

Figure 2:
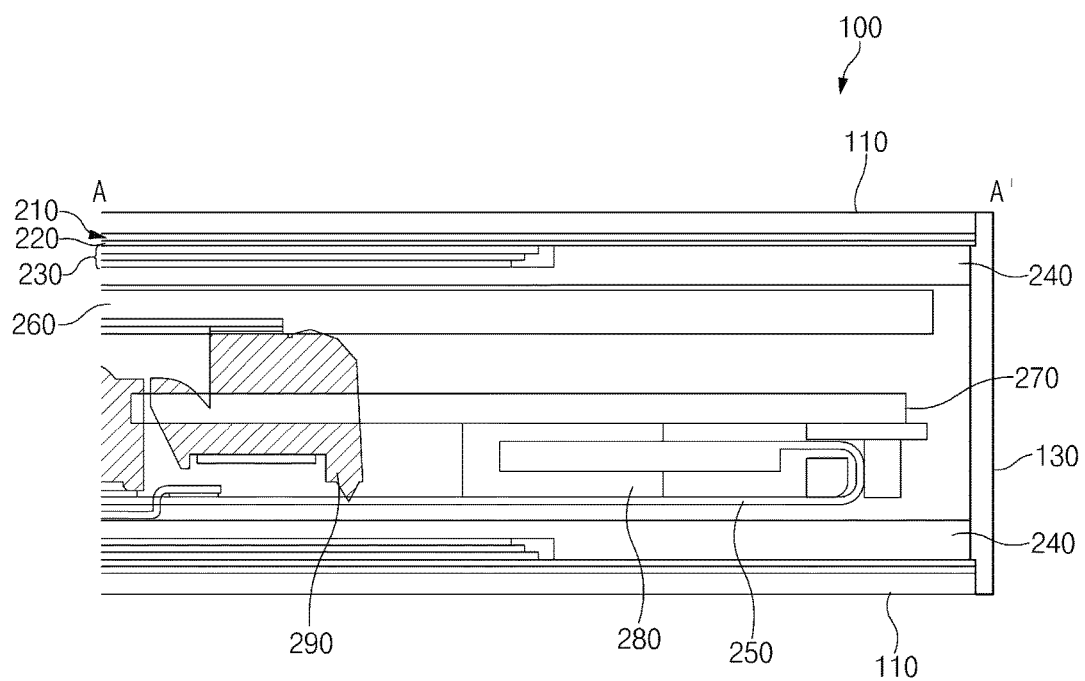
FIG. 2 is a sectional view taken along line A-A' of FIG. 1 according to an embodiment of the present disclosure.

FIG. 2 is a sectional view taken along line A-A' of FIG. 1 according to an embodiment of the present disclosure.

Referring to FIG. 2, the electronic device 100 may be configured such that the window 110 as an external protective layer may be provided at the outermost side of the electronic device 100. According to an embodiment, the window 110 may not include at least one of the upper surface and the lower surface or may include an opening, and a cover (e.g., the lower end cover 130) may be coupled to at least one of the upper side and the lower side of the window 110 such that the hollow provided in the window 110 is not exposed to the outside.

A bonding layer 210, a printed film layer 220, a display module 230, and a display bracket 240 may be stacked inside the window 110. The bonding layer 210 may couple the printed film layer 220 and the window 110 such that the display module 230, to which the printed film layer 220 is bonded, may be fixed to an inside of the window 110. According to an embodiment, the bonding layer 210 is a bonding member, and may be formed of an optically clear resin (OCR) or an optically clear adhesive (OCA). The printed film layer 220 may be configured such that a component located inside the window 110 is not viewed from the outside. A film in which an ink (or a paint) of an opaque color is printed or a letter, a number, a symbol, or a figure is printed may be disposed in the printed film layer 220. The printed film layer 220 may include an ultraviolet (UV) molding layer, a deposition layer, and a printing layer to embody a specific pattern or design. According to various embodiments, the printed film layer 220 may be omitted.

The display module 230, for example, may include a liquid crystal display (LCD), a light emitting diode (LED) display, an organic LED (OLED) display, a plastic OLED (POLED), a microelectromechanical system (MEMS) display, or an electronic paper display. As another example, the display module 230 may include a flexible display. For example, the display module 230 may be flat, flexible, or curved.

The display module 230 may display various contents (e.g., a text, an image, a video, an icon, and a symbol). Further, the display module 230 may include a touch screen and receive, for example, a touch, a gesture, a proximity, or a hovering input using an electronic pen or the user's body.

According to various embodiments, the display module 230 may include a plurality of layers. According to an embodiment, the display module 230 may include a touch detection layer, a display layer, a pressure detection layer, or the like. However, the present disclosure is not limited thereto. According to various embodiments, at least one of the layers of the display module 230 may be excluded, or at least one other layer (e.g., an antenna layer or a fingerprint recognition layer) may be further included.

The touch detection layer, for example, may include a touch sensor that may detect a contact or an approach of a touch object (e.g., an electronic pen or a portion of the body of the user). According to an embodiment, the touch detection layer may be arranged in the form of a panel, and in this case, may be referred to as a touch panel. The touch sensor may include a conductive material, and may be arranged in a transverse axis and a longitudinal axis in the touch panel to define a lattice structure.

The display layer may be arranged in the form of a panel, and may be referred to as a display panel. The display panel may have different structures and forms based on a manner of implementing colors. According to an embodiment, the display panel may include a polymer layer, a plurality of display elements that is coupled to one surface of the polymer layer, and at least one conductive line that is coupled to the polymer layer and is electrically connected to the plurality of display elements. According to an embodiment, the polymer layer may include polyimide. The plurality of display elements is arranged on one surface of the polymer layer in a matrix form to define pixels of the display panels, and may include a fluorescent material or an organic fluorescent material that may express colors. According to an embodiment, the plurality of display elements may include organic light emitting diodes (OLEDs). The conductive line may include at least one gate signal line or at least one data signal line. According to an embodiment, a plurality of gate signal lines and a plurality of data signal lines are arranged in a matrix form, and the plurality of display elements may be arranged adjacent to points where lines cross each other and may be electrically connected to each other.

According to various embodiments, the display panel may be connected to a display driver integrated circuit (DDI). The display driving circuit may be electrically connected to the conductive line. The display driving circuit may include a driver integrated circuit (IC) that provides a driving signal and an image signal to the display panel, or a timing controller (T-con) that controls the driving signal and the image signal. The driver IC may include a gate driver IC that sequentially selects the gate signal lines of the display panel and applies a scan signal (or a driving signal) to the selected gate signal lines, and a data driver IC (or a source driver IC) that applies an image signal to the data signal lines of the display panel. According to an embodiment, if the gate driver IC selects a gate signal line, and applies a scan signal to the selected gate signal lines to convert the corresponding display element into an active state, the data driver IC may apply an image signal to the corresponding display element through the data signal line. The timing controller may adjust a transmission time of the signal transmitted to the driver IC to prevent a difference between display times that may occur in a process of outputting the adjusted transmission time on the display panel. According to an embodiment, the display driving circuit may be mounted on a printed circuit board 270. As another example, the display module 230 may include a flexible printed circuit board 250, and the flexible printed circuit board 250 may be connected to the printed circuit board 270 through a connector 280.

The pressure detection layer, for example, may detect a pressure applied from the outside and may convert the detected pressure to an electrical signal that may be used for measurement or control. According to an embodiment, the pressure detection layer may include a pressure sensor, and in some embodiments, may include a piezoelectric element (e.g., a piezo sensor).

The display bracket 240 may be provided such that the display module 230 may be seated on the display bracket 240. According to an embodiment, the display bracket 240 may be substantially cylindrical. According to an embodiment, the display bracket 240 may include a front surface and a rear surface that are substantially planar, and a side surface of the display bracket 240, which surrounds the front surface and the rear surface, may be a curved surface having a specific curvature. As another example, at least one of the front surface and the rear surface of the display bracket 240 may be a curved surface. The shape of the display bracket 240 may be similar to or the same as the shape of the window 110. As another example, the display bracket 240 may be provided such that the length, the width, and the size of the hollow of the display bracket 240 may be smaller than the length, the width, and the size of the hollow of the window 110 so that the display bracket 240 may be inserted into the window 110.

A hardware bracket 260, on which various components and mechanisms are seated, may be provided inside the display bracket 240. The printed circuit board 270, on which various electronic components 290 (e.g., a processor, a memory, or a communication module) are mounted, may be seated on the display bracket 240. The printed circuit board 270 may be electrically connected to the flexible printed circuit board 250 connected to a portion of the display module 230. As an example, the printed circuit board 270 may be electrically connected to the flexible printed circuit board 250 through the connector 280.

Figure 3:
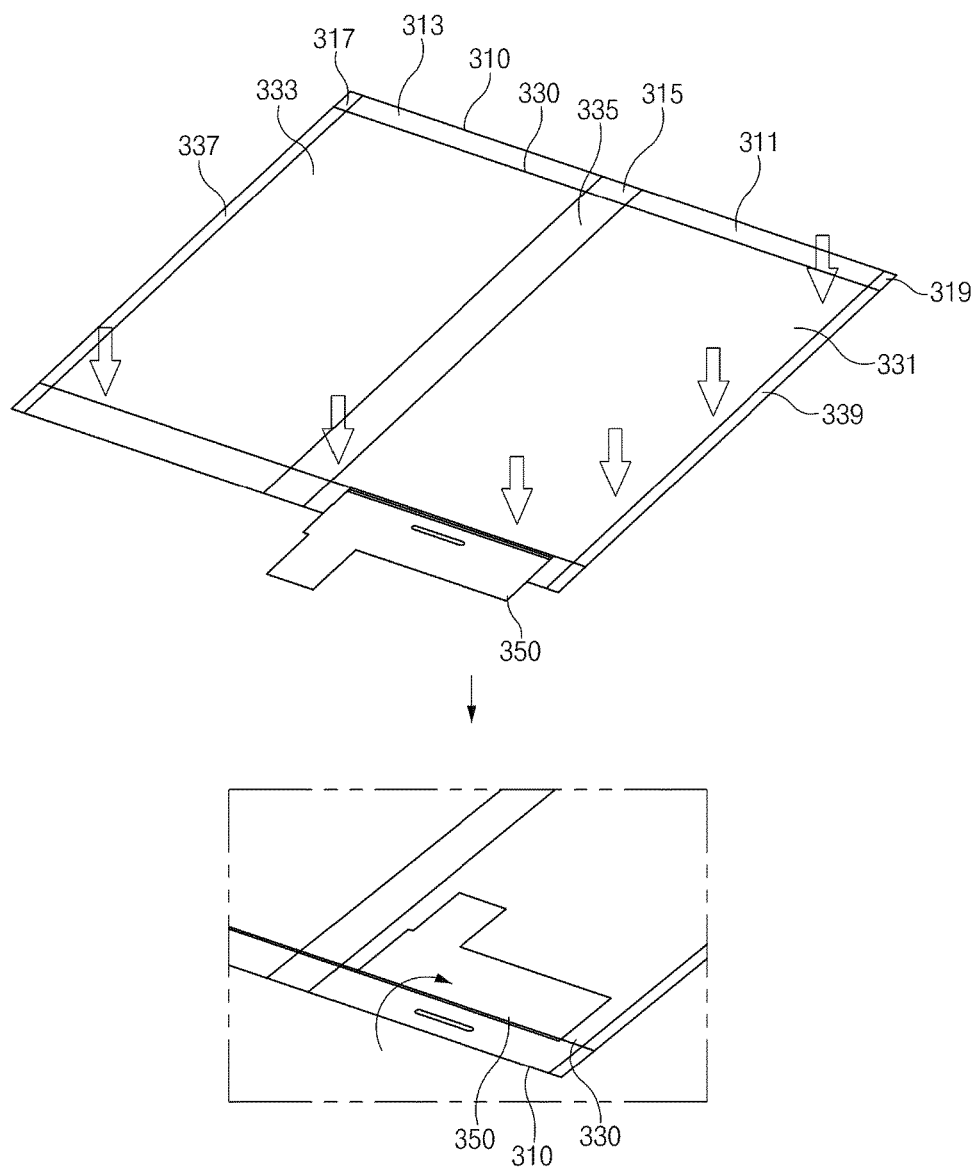
FIG. 3 is a view illustrating a process of bonding a display and a printed film according to an embodiment of the present disclosure.

FIG. 3 is a view illustrating a process of bonding a display and a printed film according to an embodiment of the present disclosure.

Referring to FIG. 3, the display 330 (e.g., the display module 230 illustrated in FIG. 2) may be bonded to one surface of the printed film 310 (e.g., the printed film layer 220 illustrated in FIG. 2). According to an embodiment, the display 330 and the printed film 310 may be bonded to each other through roll lamination while being deployed. As illustrated in the drawing, while the display 330 and the printed film 310 are deployed, the display 330 and the printed film 310 may be bonded to each other such that a front surface 331 of the display 330 is arranged on a front surface 311 of the printed film 310 and a rear surface 333 of the display 330 is arranged on a rear surface 313 of the printed film 310. In this case, as a left side surface 335 (or a right side surface) of the display 330 is arranged on a left side surface 315 (or a right side surface) of the printed film 310, a front surface 331 and a rear surface 333 of the display 330 may be deployed to opposite sides with reference to the left side surface 335 (or the right side surface) of the display 330. Further, a first right side surface 337 and a second right side surface 339 corresponding to the right side surface (or the left side surface) of the display 330 may be disposed on a first right side surface 317 and a second right side surface 319 corresponding to the right side surface (or the left side surface) of the printed film 310. Although the drawing illustrates a state in which the first right side surface 337 and the second right side surface 339 are separated from each other, the present disclosure is not limited thereto. In some embodiments, the first right side surface 337 and the second right side surface 339 may extend from the front surface 331 or the rear surface 333 while being connected to each other.

According to various embodiments, the display 330 may include a flexible printed circuit board 350 (e.g., the flexible printed circuit board 250). The drawing illustrates a state in which the flexible printed circuit board 350 is connected to the front surface 331 of the display 330. The flexible printed circuit board 350 may be folded towards the front surface 331 of the display 330. According to an embodiment, when the display bracket (e.g., the display bracket 240 illustrated in FIG. 2), to which the display 330 is attached, is inserted into the window (e.g., the window 110 illustrated in FIG. 1), the flexible printed circuit board 350 may be folded towards the front surface 331 of the display 330 to be inserted.

Figure 4A:
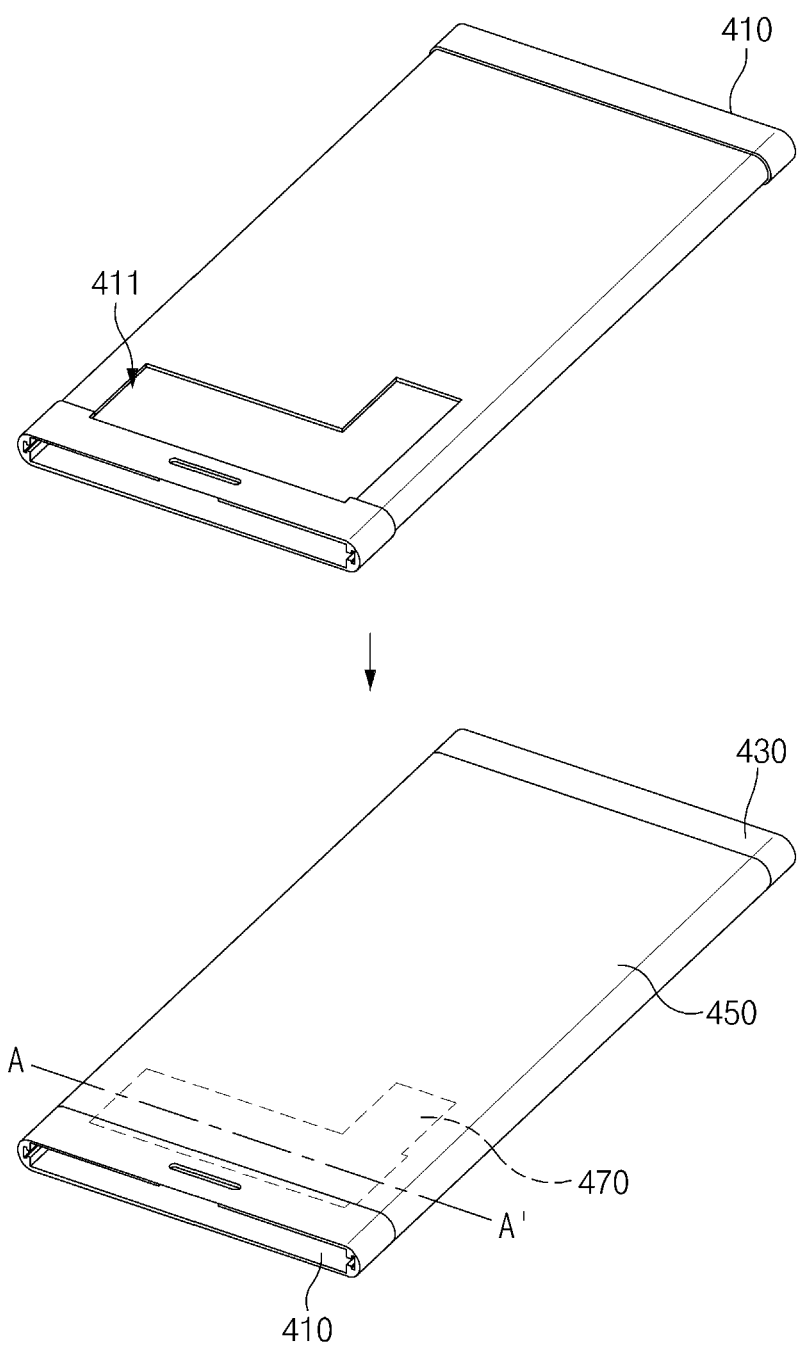
FIG. 4A is a view illustrating a process of attaching the display, to which the printed film is bonded, to the display bracket according to an embodiment of the present disclosure.
Figure 4B:
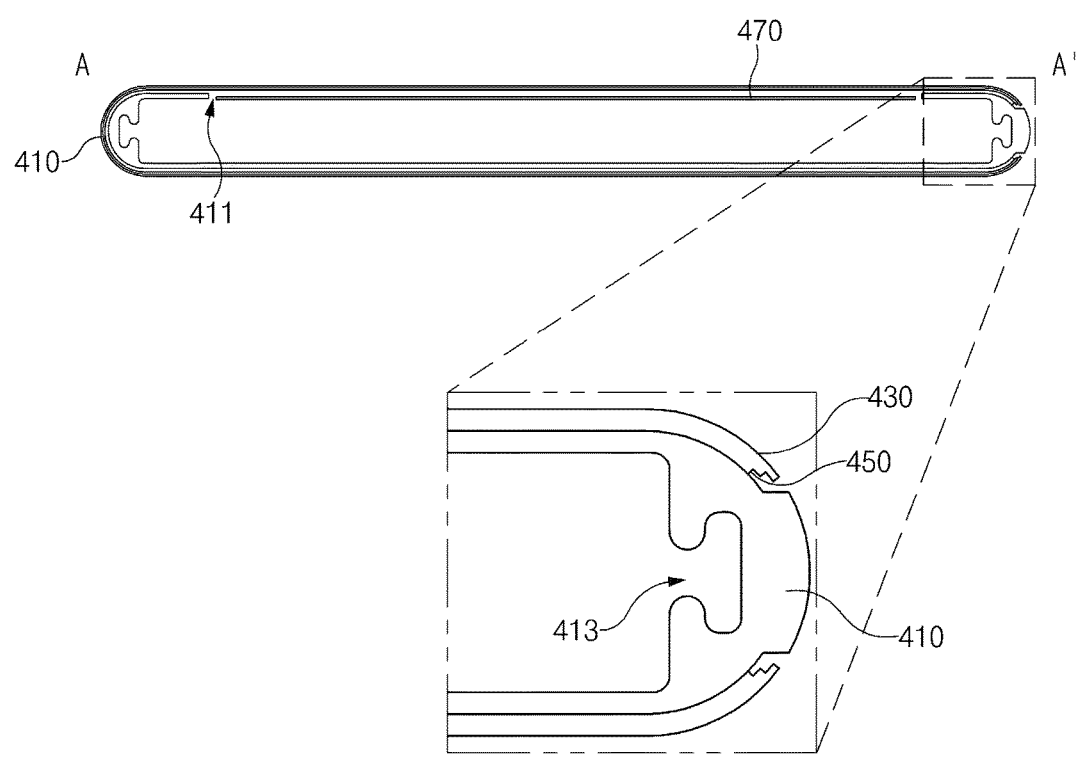
FIG. 4B is a sectional view taken along line A-A' of FIG. 4A according to an embodiment of the present disclosure.

FIG. 4A is a view illustrating a process of attaching the display, to which the printed film is bonded, to the display bracket according to an embodiment of the present disclosure, and FIG. 4B is a sectional view taken along line A-A' of FIG. 4A according to an embodiment of the present disclosure.

Referring to FIGS. 4A and 4B, the display 450 (e.g., the display 330 illustrated in FIG. 3), to which the printed film 430 (e.g., the printed film 310 illustrated in FIG. 3) is bonded, may be attached to the display bracket 410 (e.g., the display bracket 240 illustrated in FIG. 2). According to an embodiment, while the display 450, to which the printed film 430 is bonded, is deployed, the display 450 may be attached to the display bracket 410 to substantially surround the display bracket 410 (e.g., as illustrated in FIG. 4B). As another example, a bonding material may be applied to a specific area of surfaces of the display 450 and the display bracket 410, which contact each other, or a bonding layer may be included on the surfaces of the display 450 and the display bracket 410.

The display bracket 410 may include an opening 411 having a specific shape that passes through one surface (e.g., a front surface) thereof. The opening 411 may be provided such that the flexible printed circuit board 470 (e.g., the flexible printed circuit board 350 illustrated in FIG. 3) included in the display 450 may be exposed to an inside of the display bracket 410 when the display 450 is attached to the display bracket 410. As an example, if the display 450 is attached to the display bracket 410 while the flexible printed circuit board 470 is folded towards the front surface of the display 450, the flexible printed circuit board 470 may be exposed to the inside of the display bracket 410 through the opening 411. According to an embodiment, the opening 411 may have a form that is the same as or similar to that of the flexible printed circuit board 470.

According to various embodiments, the display 450 may be configured such that at least a portion of the display 450 is not connected to another portion (e.g., opposite portion) of the display 450 when the display 450 is attached to the display bracket 410 to surround the display bracket 410. For example, as illustrated in the drawing, the display 450 may be attached to the display bracket 410 while one side surface (e.g., the right side surface or the left side surface) of the display 450 is not connected to the display bracket 410. As an example, the display 450 may be attached to the display bracket 410 while the first right side surface (e.g., the first right side surface 337) and the second right side surface (e.g., the second right side surface 339) corresponding to the right side surface (or the left side surface) of the display 450 are not connected to each other. As the display 450 is attached to the display bracket 410 while one side surface of the display 450 is not connected to the display bracket 410, the display 450 may be prevented from coming out when a portion of the display 450 is bent. For example, if the display 450 is bent to the rear side, the front surface of the display 450 may surround the display bracket 410 in a smaller area than the rear surface of the display 450. Accordingly, if the display 450 is bent such that the front surface of the display 450 fully surrounds the display bracket 410, an area of the rear surface of the display 450 is left after the rear surface of the display 450 surrounds the entire display bracket 410, which may cause the display 450 to come out.

According to various embodiments, the display bracket 410 may have a recess 413 having a specific shape on an inner surface thereof. According to an embodiment, the recess 413 may extend vertically by a specific length along an inner surface of the display bracket 410. The recess 413 may have a T-shaped rail shape such that the hardware bracket may be slid when the hardware bracket (e.g., the display bracket 240 illustrated in FIG. 2) may be inserted into the display bracket 410. Further, the recess 413 may fix the hardware bracket inserted into the display bracket 410 such that the hardware bracket is not separated. The shape of the recess 413 is not limited to the T-shaped rail shape. The hardware bracket may be slid to the inside of the display bracket 410, and all forms in which the hardware bracket is not separated from the display bracket 410 are possible.

Figure 5A:
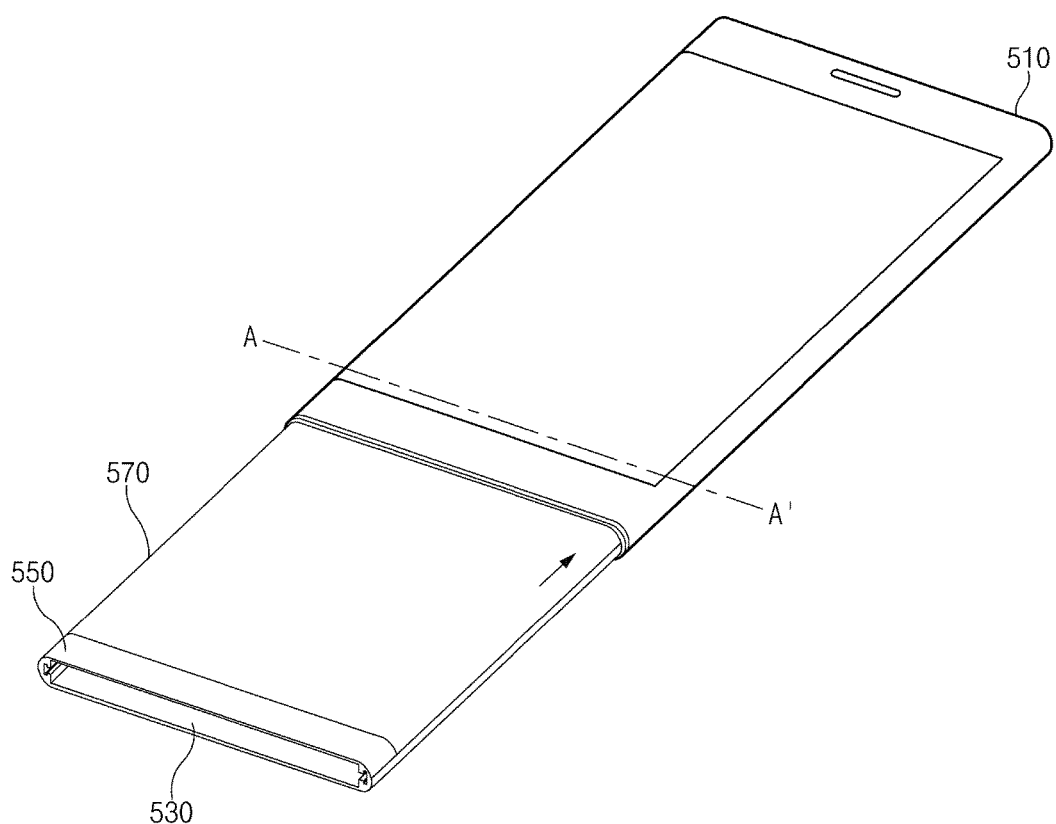
FIG. 5A is a view illustrating a process of inserting a display bracket, to which a display is attached, into an enclosed window according an embodiment of the present disclosure.
Figure 5B:
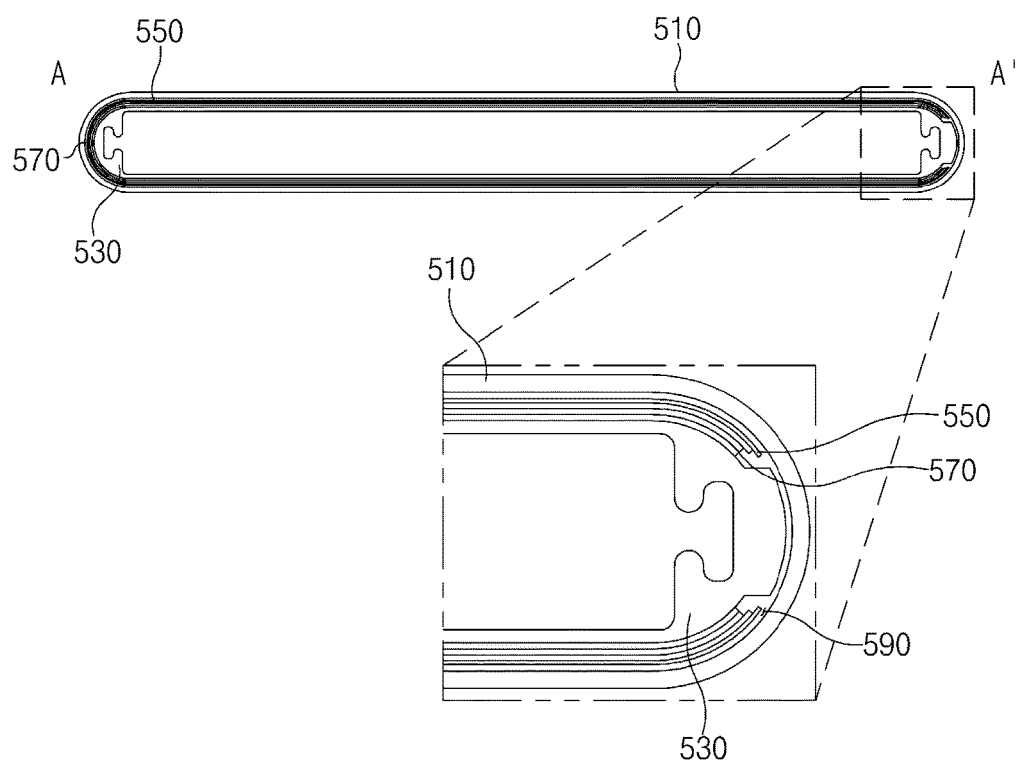
FIG. 5B is a sectional view taken along line A-A' of FIG. 5A according to an embodiment of the present disclosure.

FIG. 5A is a view illustrating a process of inserting a display bracket, to which a display is attached, into an enclosed window according an embodiment of the present disclosure, and FIG. 5B is a sectional view taken along line A-A' of FIG. 5A according to an embodiment of the present disclosure.

Referring to FIGS. 5A and 5B, a display 570 (e.g., the display 450 illustrated in FIG. 4) to which the printed film 550 (e.g., the printed film 430) is bonded may be attached to a display bracket 530 (e.g., the display bracket 410), and may be inserted into an enclosed widow 510 (e.g., the window 110 illustrated in FIG. 1). According to an embodiment, when the display bracket 530 is inserted into the window 510, the printed film 550 and the window 510 may form a gap 590 of a specific size. In some embodiments, when the printed film 550 is not bonded to the display 570, the display 570 may form the gap 590 of the specific size with the window 510. A process of inserting the display bracket 530 while forming the gap 590 of the specific size will be described in detail through the following embodiment.

According to various embodiments, an optical clear resin or an optically clear adhesive (OCA) as a bonding member may be inserted (or injected) into the gap 590. If the bonding member is inserted (or injected) into the gap 590, the bonding member may be cured by irradiating an ultraviolet (UV) ray (or light) to the window 510. As the bonding member is cured, the window 510 and the printed film 550 (or the display 570) may be coupled to each other.

Figure 6:
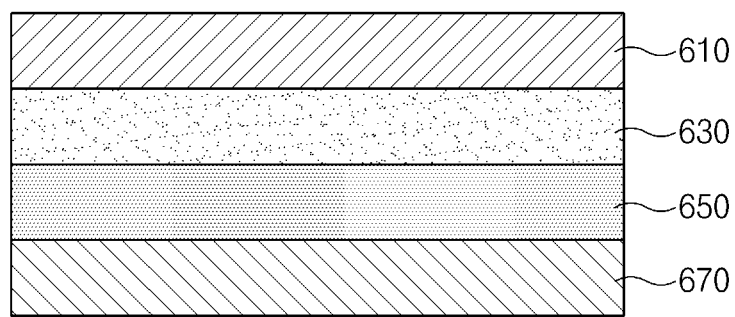
FIG. 6 is a view illustrating a stack structure of a window and a display according to an embodiment of the present disclosure.

FIG. 6 is a view illustrating a stack structure of a window and a display according to an embodiment of the present disclosure.

Through the processes illustrated in FIGS. 3, 4A, 4B, 5A, and 5B, a window and a display may constitute a stack structure.

Referring to FIG. 6, a window 610, a bonding layer 630, a printed film layer 650, and a display 670 may be sequentially stacked. According to an embodiment, the bonding layer 630 is a bonding member and may include an optically clear resin (OCR) or an optically clear adhesive (OCA). Accordingly, as an ultraviolet (UV) ray (or light) is irradiated to the window 610, the bonding member is cured to couple the window 610 and the printed film layer 650.

According to various embodiments, the printed film layer 650 may be omitted. In this case, if the bonding member is cured, the window 610 and the display 670 may be coupled to each other. However, when the printed film layer 650 is included, it is preferable that the printed film layer 650 be disposed under the bonding layer 630. As an example, if the printed film layer 650 is disposed on the bonding layer 630, the printed film layer 650 may shield an ultraviolet ray to hamper curing of the bonding member.

Figure 7A:
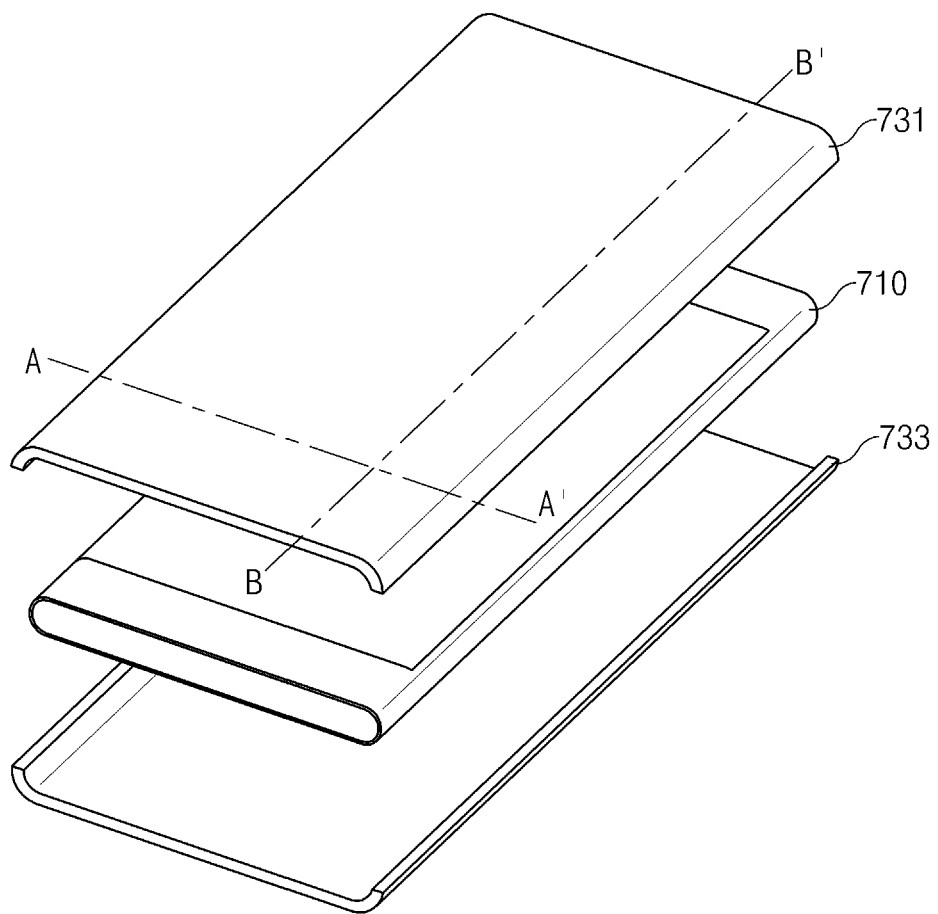
FIG. 7A is a view illustrating a process of fixing an enclosed window to a first jig according to an embodiment of the present disclosure.
Figure 7B:
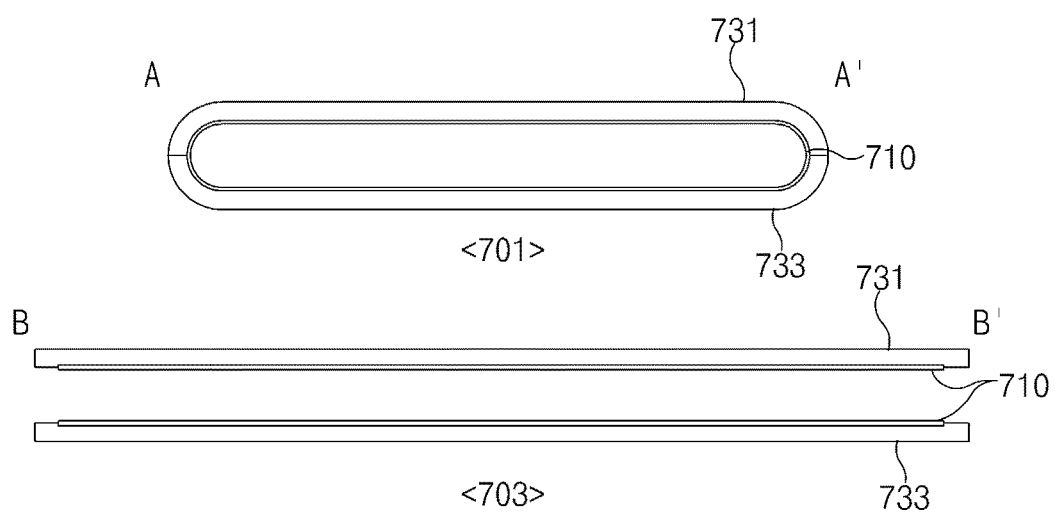
FIG. 7B illustrates sectional views taken along line A-A' and line B-B' of FIG. 7A according to an embodiment of the present disclosure.

FIG. 7A is a view illustrating a process of fixing an enclosed window to a first jig according to an embodiment of the present disclosure, and FIG. 7B illustrates sectional views taken along line A-A' and line B-B' of FIG. 7A according to an embodiment of the present disclosure. In FIG. 7B, a first state 701 indicates a section taken along line A-A' of FIG. 7A and a second state 703 indicates a section taken along line B-B' of FIG. 7A.

Referring to FIGS. 7A and 7B, an enclosed window 710 may be fixed by using an upper part 731 and a lower part 733 of a first jig such that, when a display bracket (e.g., the display bracket 530) is inserted into the window 710, the window 710 and a printed film (e.g., the printed film 550) (or a display (e.g., the display 570)) attached to the display bracket forms a gap (e.g., the gap 590) of a specific size. According to an embodiment of the present disclosure, the upper part 731 and the lower part 733 of the first jig may fix the window 710 to surround a front surface and a rear surface of the window 710.

Figure 8A:
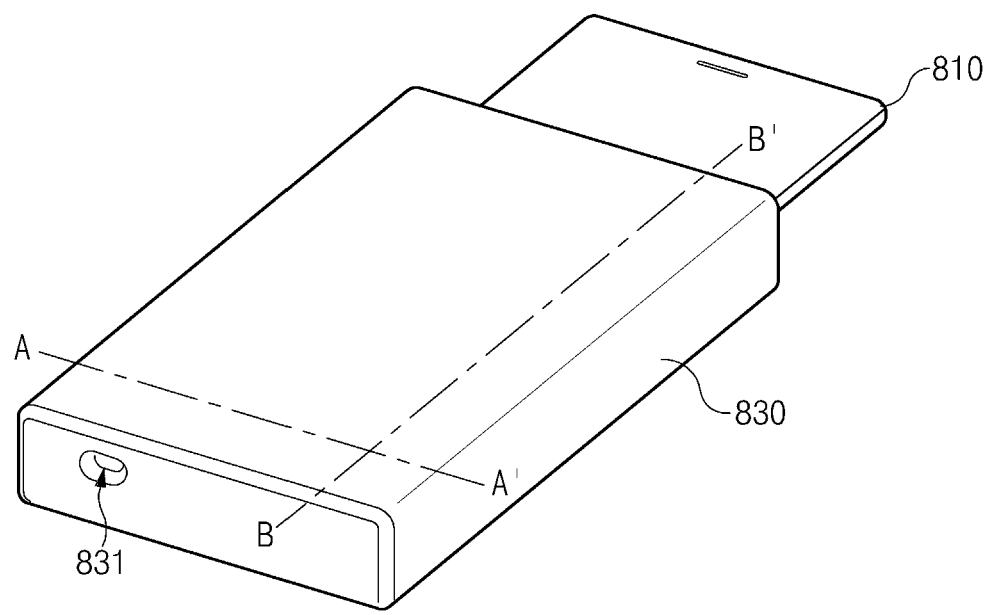
FIG. 8A is a view illustrating a process of fixing a display bracket, to which a display is attached, to a second jig according to an embodiment of the present disclosure.
Figure 8B:
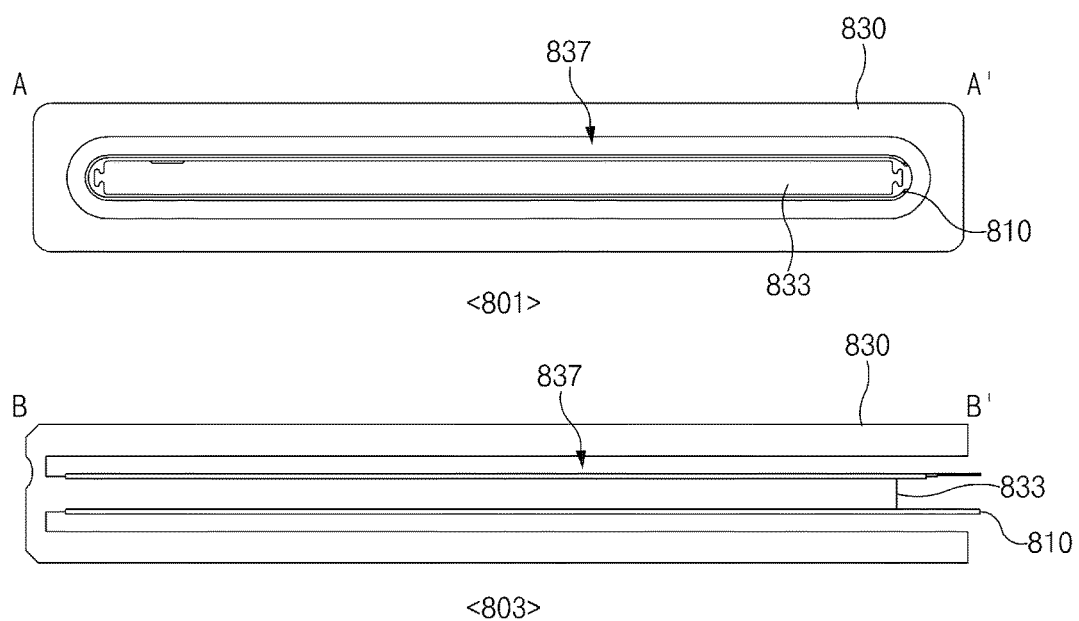
FIG. 8B is sectional views taken long line A-A' and line B-B' of FIG. 8A according to an embodiment of the present disclosure.
Figure 8C:
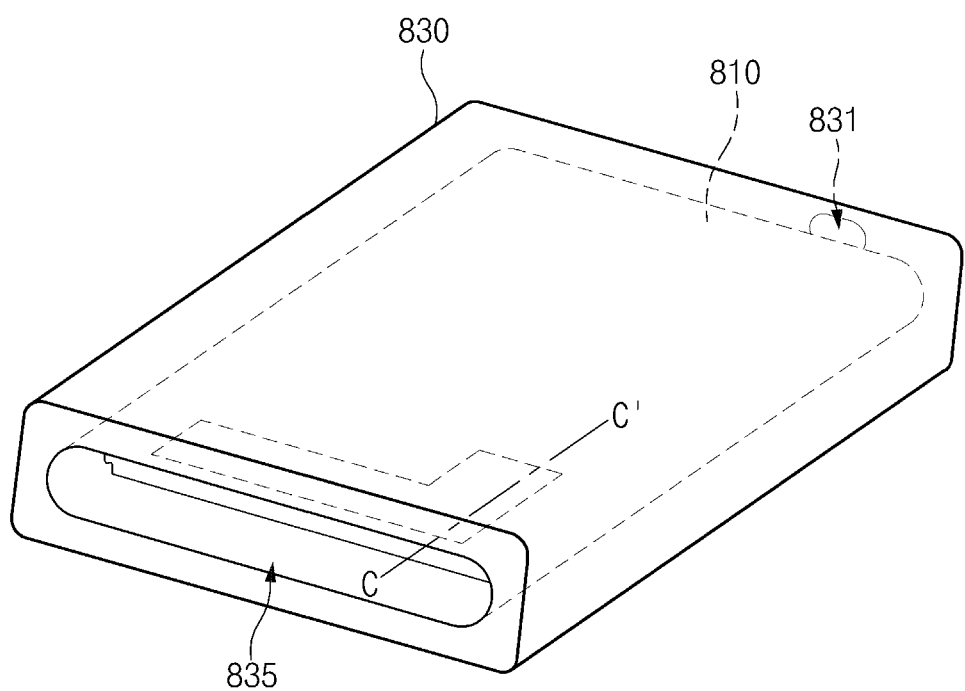
FIG. 8C is a view illustrating a state in which the display bracket, to which the display is attached, is fixed to the second jig according to an embodiment of the present disclosure.
Figure 8D:
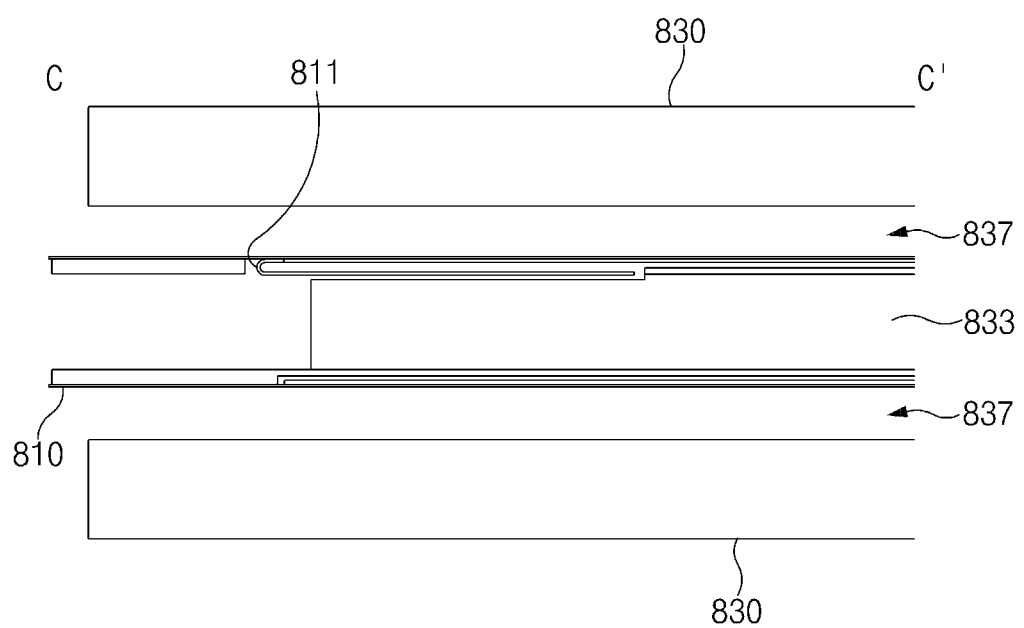
FIG. 8D is a sectional view taken along line C-C' of FIG. 8C according to an embodiment of the present disclosure.

FIG. 8A is a view illustrating a process of fixing a display bracket, to which a display is attached, to a second jig according to an embodiment, FIG. 8B is sectional views taken long line A-A' and line B-B' of FIG. 8A according to an embodiment of the present disclosure, FIG. 8C is a view illustrating a state in which the display bracket, to which the display is attached, is fixed to the second jig according to an embodiment of the present disclosure, and FIG. 8D is a sectional view taken along line C-C' of FIG. 8C according to an embodiment. In FIG. 8B, a first state 801 indicates a section taken along line A-A' of FIG. 8A and a second state 803 indicates a section taken along line B-B' of FIG. 8A.

Referring to FIGS. 8A and 8B, when a display bracket 810 (e.g., the display bracket 530 illustrated in FIG. 5) is inserted into a window (e.g., the window 710 illustrated in FIG. 7), the display bracket 810 may be fixed to a second jig 830 such that the window and a printed film (e.g., the printed film 550) (or a display (e.g., the display 570)) attached to the display bracket 810 may form a gap (e.g., the gap 590) of a specific size. According to an embodiment, the display bracket 810 may be inserted into and fixed to a cavity 837 provided inside the second jig 830. The cavity 837 provided inside the second jig 830 may have a specific size such that the display bracket 810 may be inserted into the cavity 837.

According to various embodiments, the second jig 830 may have a fixing part 833 therein. The fixing part 833 may extend by a specific length from a portion of an inner surface of the second jig 830 towards an opposite surface of the second jig 830. As another example, the fixing part 833 may be smaller than the size of a hollow provided inside the display bracket 810 such that the display bracket 810 may be inserted along an outer surface of the fixing part 833. Further, the fixing part 833 may have a shape that is the same as or similar to a hollow provided inside the display bracket 810. The drawing illustrates a state in which the fixing part 833 is formed in the cavity 837 provided inside the second jig 830 and the cavity 837 is separated towards the upper and lower sides of the fixing part 833. Further, the drawing illustrates a state in which the display bracket 810 is inserted along the upper and lower surfaces of the fixing part 833 to be fixed. In this case, a flexible printed circuit board 811 of the display attached to the display bracket 810 may be inserted while being folded.

According to various embodiments, the second jig 830 may include an insertion hole 831 that passes through one surface of the second jig 830 such that a bonding member may be inserted into the insertion hole 831. The drawing illustrates a state in which the insertion hole 831 passes through a surface of the second jig 830, from which the fixing part 833 extends. However, the present disclosure is not limited thereto. The insertion hole 831 may have various shapes that extend from one surface of the second jig 830 to the cavity 837 provided inside the second jig 830. As another example, the second jig 830 includes an opening 835 on one surface thereof, and the display bracket 810 may be inserted through the opening 835. The drawing illustrates a state in which the opening 835 is formed on a surface of the second jig 830, which is opposite to the surface on which the insertion hole 831 is formed.

Figure 9A:
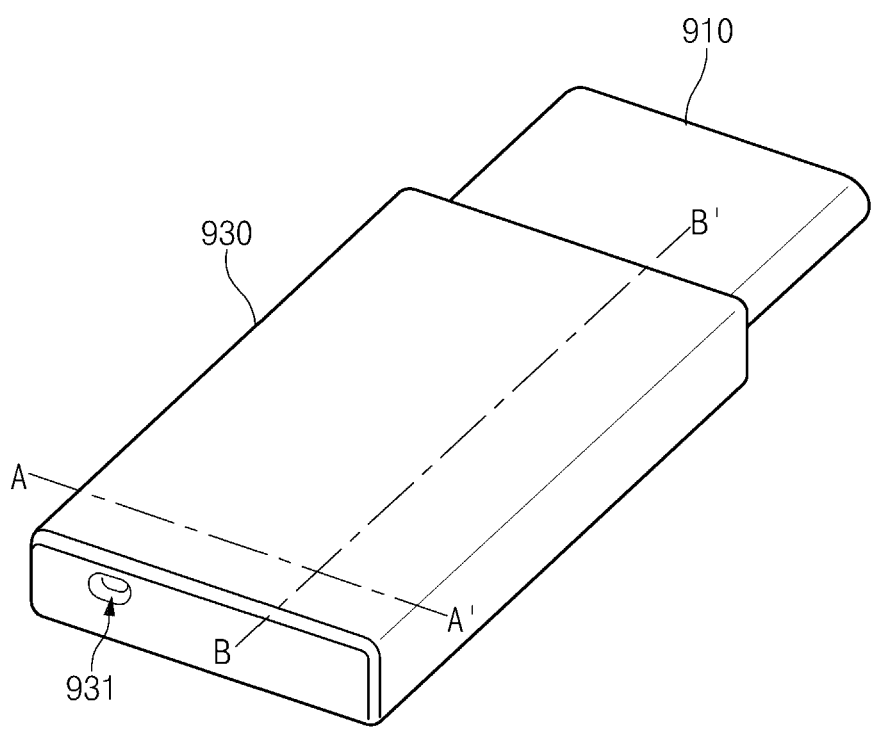
FIG. 9A is a view illustrating a process of inserting a first jig into a second jig according to an embodiment of the present disclosure.
Figure 9B:
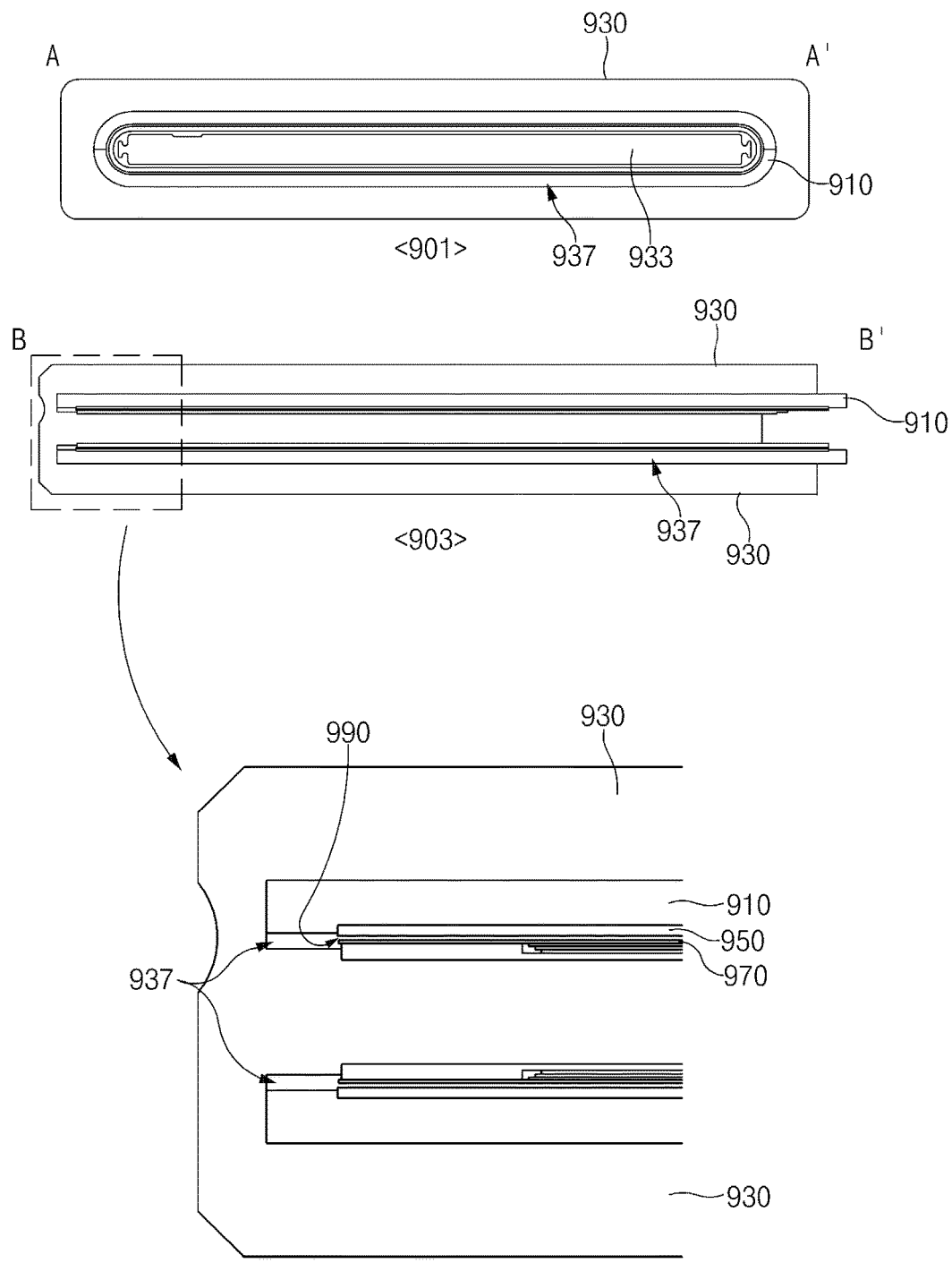
FIG. 9B is a sectional view taken along line A-A' and line B-B' of FIG. 9A according to an embodiment of the present disclosure.

FIG. 9A is a view illustrating a process of inserting a first jig into a second jig according to an embodiment of the present disclosure, and FIG. 9B is a sectional view taken along line A-A' and line B-B' of FIG. 9A according to an embodiment of the present disclosure. In FIG. 9B, a first state 901 indicates a section taken along line A-A' of FIG. 9A and a second state 903 indicates a section taken along line B-B' of FIG. 9A.

Referring to FIGS. 9A and 9B, a first jig 910, to which a window 950 (e.g., the window 710) is fixed, may be inserted into a second jig 930, to which a display bracket (e.g., the display bracket 810) is fixed. According to an embodiment, the first jig 910 may be inserted into a cavity 937 (e.g., the cavity 837) provided inside the second jig 930. For example, the first jig 910 may be inserted along an outer surface of a fixing part 933 (e.g., the fixing part 833) formed in a cavity 937 of the second jig 930.

According to various embodiments, if the first jig 910 is inserted into the second jig 930, the window 950 fixed to the first jig 910 may form a gap 990 of a specific size with a printed film 970 (or a display) attached to a display bracket fixed to the second jig 930. Accordingly, if a bonding member is inserted (or injected) through an insertion hole 931 (e.g., the insertion hole 831) that passes through one surface of the second jig 930, the bonding member may be inserted into the gap 990. As an example, if an optically clear resin (OCR) is inserted (or injected) into the insertion hole 931, the OCR may be inserted into the gap 990 while flowing into the cavity 937 connected to the insertion hole 931 to be filled in the cavity 937.

Figure 10A:
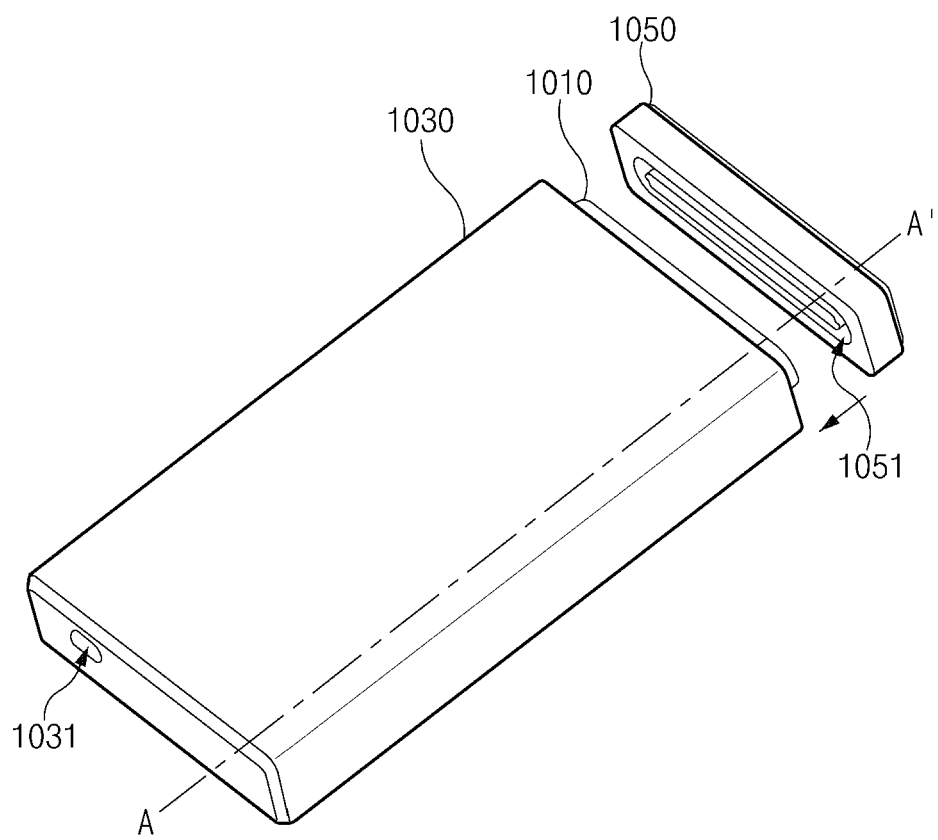
FIG. 10A is a view illustrating a process of sealing a first jig inserted into a second jig by using a third jig according to an embodiment of the present disclosure.
Figure 10B:
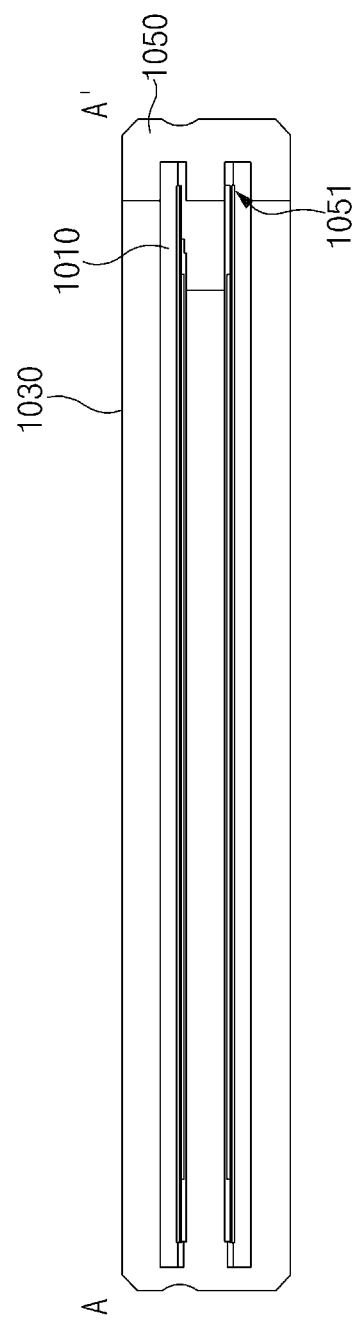
FIG. 10B is a sectional view taken along line A-A' of FIG. 10A according to an embodiment of the present disclosure.
Figure 10C:
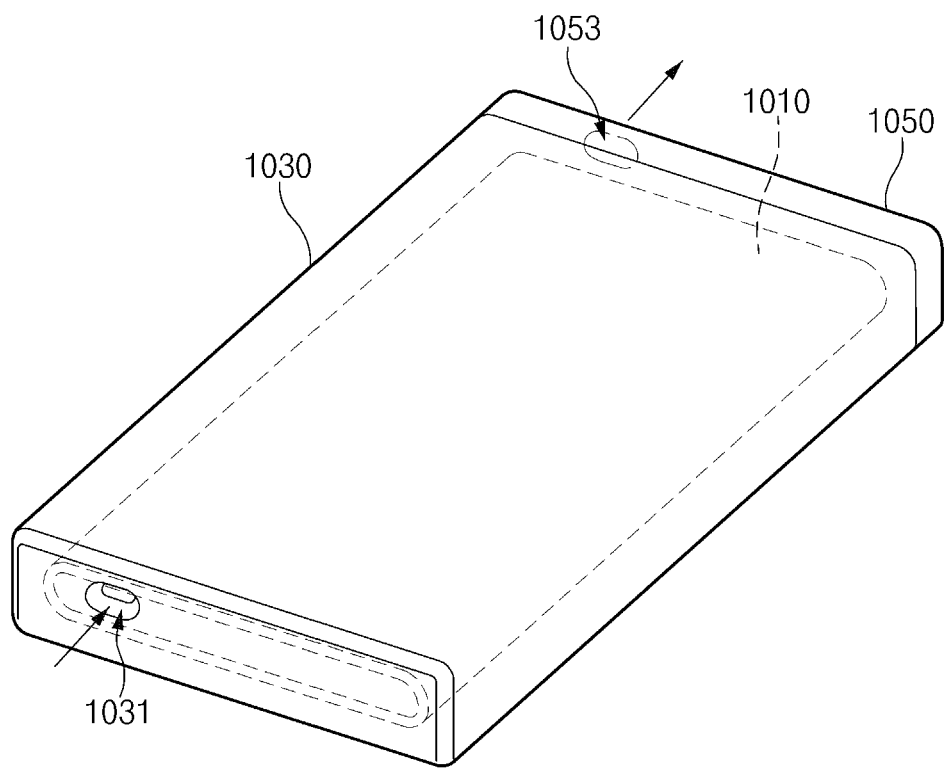
FIG. 10C is a view illustrating a state in which the first jig inserted into the second jig is sealed by the third jig according to an embodiment of the present disclosure.

FIG. 10A is a view illustrating a process of sealing a first jig inserted into a second jig by using a third jig according to an embodiment of the present disclosure, FIG. 10B is a sectional view taken along line A-A' of FIG. 10A according to an embodiment of the present disclosure, and FIG. 10C is a view illustrating a state in which the first jig inserted into the second jig is sealed by the third jig according to an embodiment of the present disclosure.

According to various embodiments, if a bonding member is inserted (or injected) into a second jig 1030, into which a first jig 1010 is inserted, through an insertion hole 1031, the bonding member may be filled in a gap (e.g., a gap 990 illustrated in FIG. 9B) formed between a window (e.g., a window 950) fixed to the first jig 1010 and a printed film (e.g., a printed film 970) (or the display) attached to a display bracket fixed to the second jig 1030 and may be discharged to the outside of the second jig 1030. In this case, if the second jig 1030 fails to maintain a sealed state having a specific pressure, the bonding member may not be inserted into the gap in a constant form. Accordingly, it is preferable that the second jig 1030 be sealed before the bonding member is inserted (or injected) while the first jig 1010 is inserted into the second jig 1030.

Referring to FIGS. 10A to 10C, while the first jig 1010 is inserted into the second jig 1030, the third jig 1050 may seal the second jig 1030 while covering an opening (e.g., the opening 835 illustrated in FIG. 8C) provided on one surface of the second jig 1030. According to an embodiment, the third jig 1050 may have a recess 1051 such that a portion of the first jig 1010 exposed to the outside through the opening provided in the second jig 1030 may be inserted into the recess 1051. The recess 1051 provided in the third jig 1050 may be provided on one surface of the third jig 1050, which is coupled to the second jig 1030. As another example the recess 1051 provided in the third jig 1050 may have a shape that is the same as or similar to the shape of a side surface of the first jig 1010.

According to various embodiments, the third jig 1050 may include a discharge hole 1053 that passes through one surface thereof. The discharge hole 1053 may function as a discharge hole for the bonding member if the bonding member is inserted (or injected) through the insertion hole 1031 formed in the second jig 1030. Although the drawing illustrates a state in which the discharge hole 1053 passes through one surface of the third jig 1050, on which the recess 1051 is formed, but the present disclosure is not limited thereto. The discharge hole 1053 may have various shapes that extends from one surface of the third jig 1050, which is connected to the gap, to an outer surface of the third jig 1050 such that the bonding member may be smoothly discharged while being filled in the gap.

According to various embodiments, at least one of the insertion hole 1031 formed in the second jig 1030 and the discharge hole 1053 formed in the third jig 1050 may be plural. As an example, two insertion holes 1031 may be provided at an upper portion and a lower portion of the second jig 1030, respectively, to be connected to cavities (e.g., the cavity 837) separated to the upper and lower sides of a fixing part (e.g., the fixing part 833). Further, two discharge holes 1053 may be provided at an upper portion and a lower portion of one surface of the third jig 1050 to correspond to the insertion holes 1031, respectively.

Figure 11A:
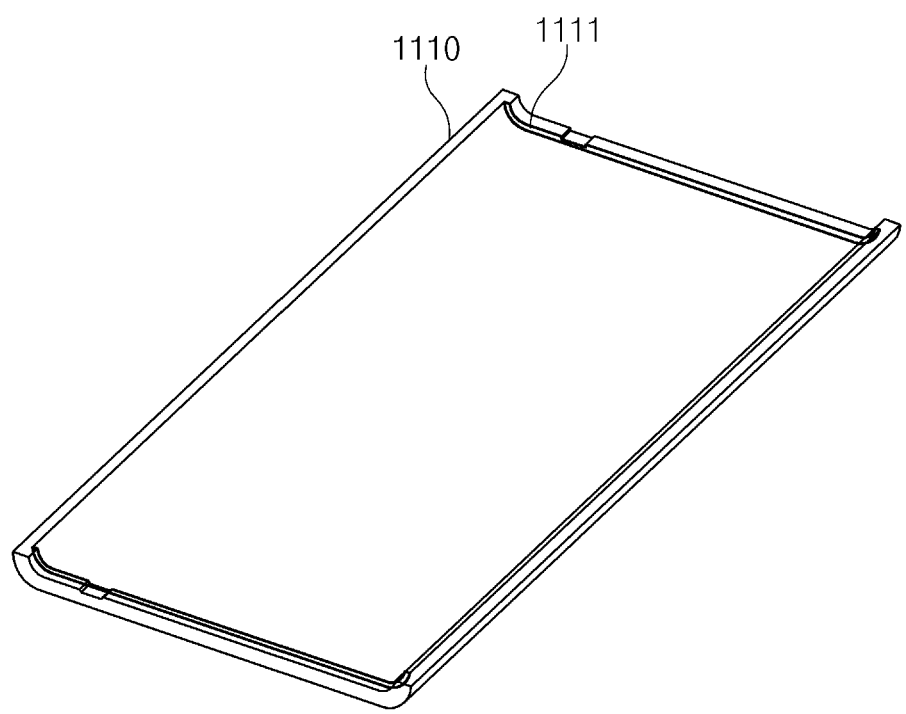
FIG. 11A is a view illustrating a first waterproof member provided in a first jig according to an embodiment of the present disclosure.
Figure 11B:
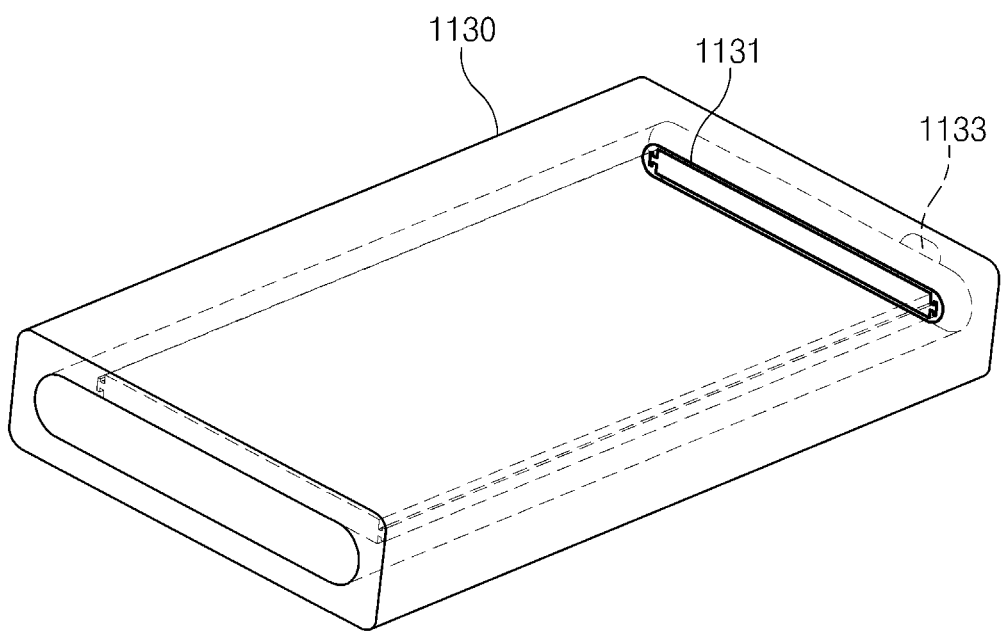
FIG. 11B is a view illustrating a second waterproof member provided in a second jig according to an embodiment of the present disclosure.
Figure 11C:
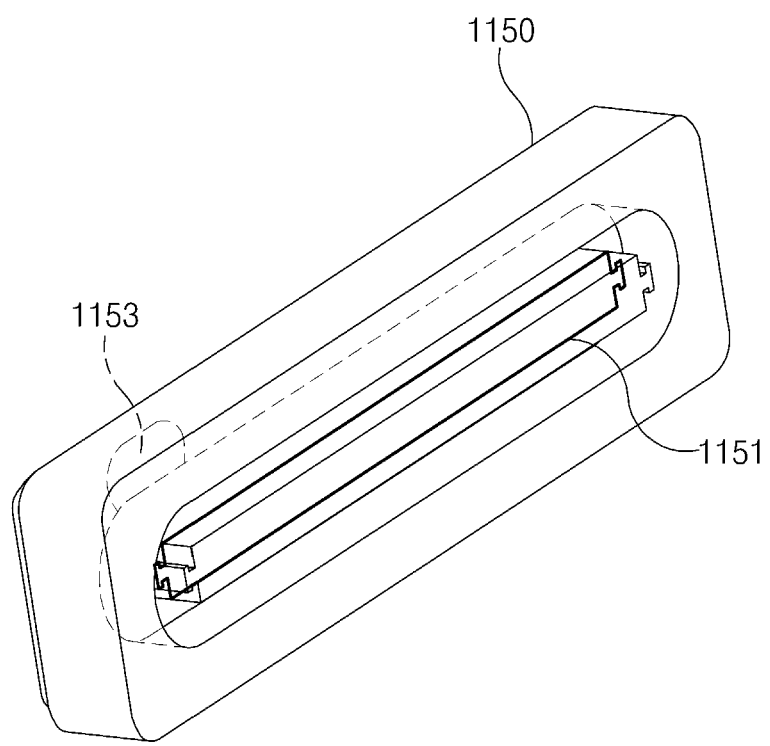
FIG. 11C is a view illustrating a third waterproof member provided in a third jig according to an embodiment of the present disclosure.
Figure 11D:
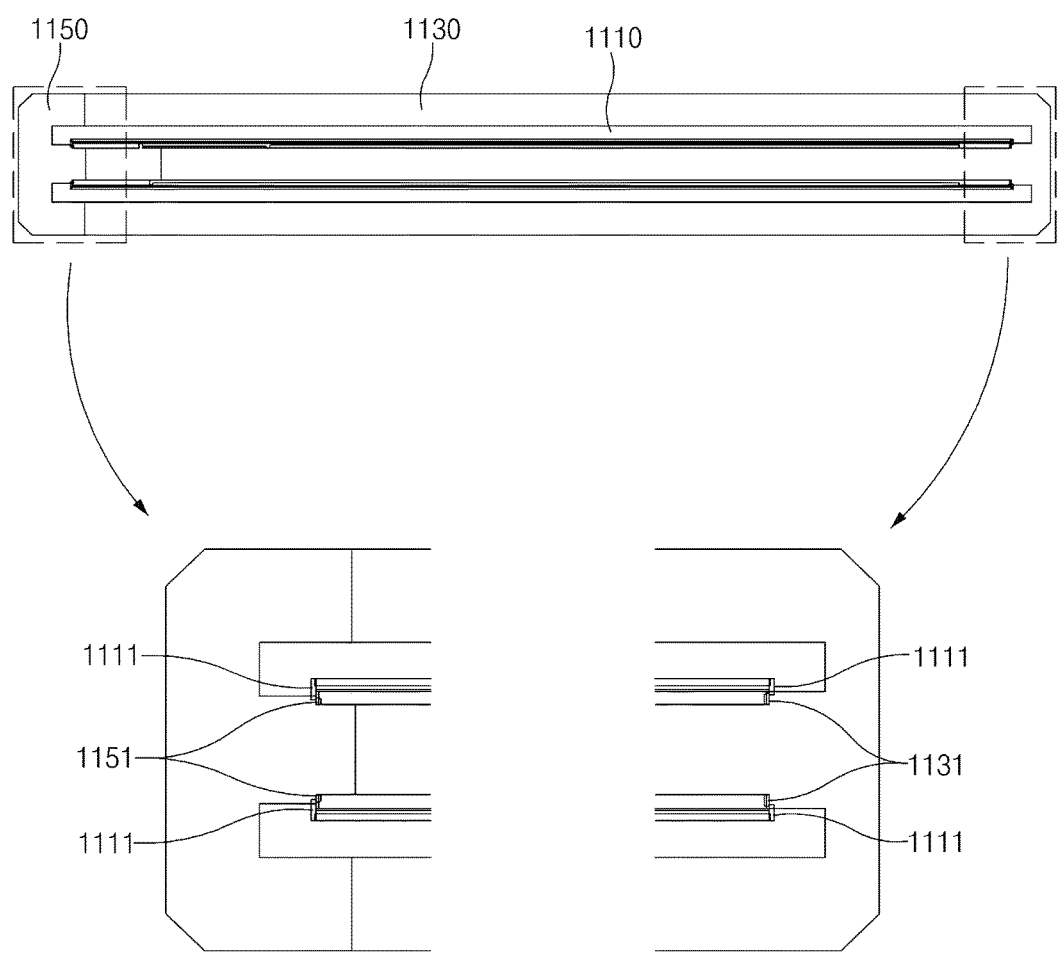
FIG. 11D is a view illustrating a waterproof structure in a state in which the first jig, the second jig, and the third jig are coupled to each other according to an embodiment of the present disclosure.
Figure 11E:
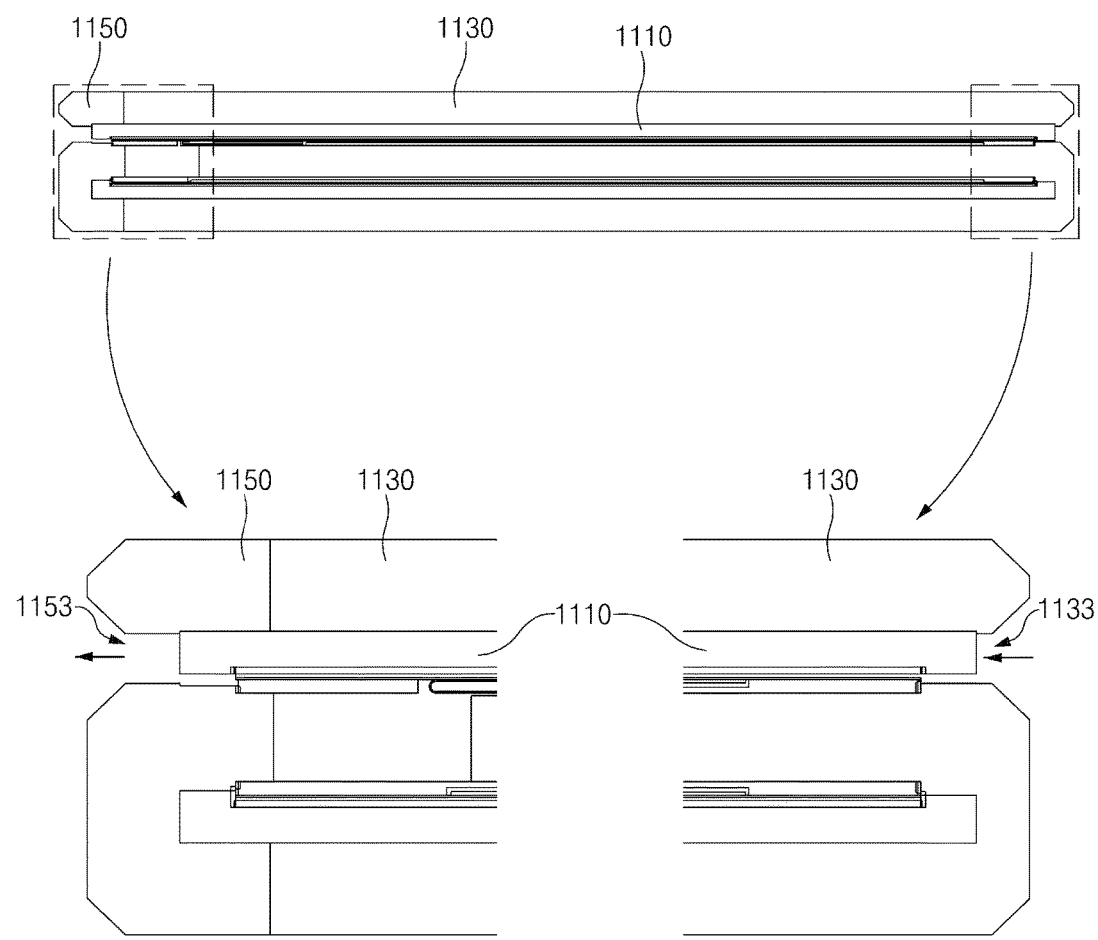
FIG. 11E is a view illustrating insertion of a bonding member in a state in which the first jig, the second jig, and the third jig are coupled to each other according to an embodiment of the present disclosure.

FIG. 11A is a view illustrating a first waterproof member provided in a first jig according to an embodiment of the present disclosure, FIG. 11B is a view illustrating a second waterproof member provided in a second jig according to an embodiment of the present disclosure, FIG. 11C is a view illustrating a third waterproof member provided in a third jig according to an embodiment of the present disclosure, FIG. 11D is a view illustrating a waterproof structure in a state in which the first jig, the second jig, and the third jig are coupled to each other according to an embodiment of the present disclosure, and FIG. 11E is a view illustrating insertion of a bonding member in a state in which the first jig, the second jig, and the third jig are coupled to each other according to an embodiment of the present disclosure.

Referring to FIGS. 11A to 11E, the first jig 1110, the second jig 1130, and the third jig 1150 may include waterproof members that prevent a bonding member inserted (or injected) through an insertion hole 1133 (e.g., the insertion hole 1031 illustrated in FIGS. 10A and 10C) of the second jig 1130 from flowing into a window (e.g., the window 710 illustrated in FIGS. 7A and 7B) fixed to the first jig 1110 and a display bracket (e.g., the display bracket 810 illustrated in FIGS. 8A, 8B and 8C) fixed to the second jig 1130.

According to an embodiment, the first jig 1110 may have a first waterproof member 1111 in a specific area of an inner surface thereof. The drawing illustrates a state in which the first waterproof member 1111 is provided on an inner surface of a lower part (e.g., the lower part 733 illustrated in FIGS. 7A and 7B) of the first jig 1110. However, the present disclosure is not limited thereto. Although not illustrated, the first waterproof member 1111 may be also provided on an inner surface of an upper part of the first jig 1110. It is preferable that the first waterproof member 1111 be connected to inner surfaces of the upper and lower parts of the first jig 1110. For example, it is preferable that while the upper and lower parts of the first jig 1110 surround the window, the first waterproof member 1111 have a shape of one band that extends along an outer surface of the window. Further, it is preferable that at least one first waterproof member 1111 be provided at an upper part of an outer surface of the window and at least one first waterproof member 1111 be provided at a lower part of the outer surface of the window.

According to an embodiment, the second jig 1130 may have a second waterproof member 1131 in a specific area of an inner surface thereof. The drawing illustrates a state in which the second waterproof member 1131 be provided inside one surface of the second jig 1130 having the insertion hole 1133. It is preferable that the second waterproof member 1131 also have a shape of a band like the first waterproof member 1111. For example, it is preferable that the second waterproof member 1131 have a shape of one band that extends along an inner side of a front surface, a rear surface, and a side surface of the second jig 1130, which face the first jig 1110.

According to an embodiment, the third jig 1150 may have a third waterproof member 1151 in a specific area of an inner surface thereof. The drawing illustrates a state in which the third waterproof member 1151 be provided inside one surface of the third jig 1050 having a recess (e.g., a recess 1051 illustrated in FIGS. 10A and 10B). It is preferable that the third waterproof member 1151 also have a shape of a band like the first waterproof member 1111 and the second waterproof member 1131. For example, it is preferable that the third waterproof member 1151 have a shape of one band that extends along an outer surface of the recess.

As illustrated in FIG. 11D, the first waterproof member 1111 formed in the first jig 1110, the second waterproof member 1131 formed in the second jig 1130, and the third waterproof member 1151 formed in the third jig 1150 may prevent the bonding member from being introduced into the window and the display bracket. In a state in which the first jig 1110, the second jig 1130, and the third jig 1150 are coupled to each other, the first waterproof member 1111 may be connected to the second waterproof member 1131 and the third waterproof member 1151. For example, if the first jig 1110 is inserted into the second jig 1130, the first waterproof member 1111 may be connected to the second waterproof member 1131 to prevent the bonding member from being introduced into the window and the display bracket. Further, if the third jig 1150 is coupled to the first waterproof member 1111 and a portion of the first jig 1110 is inserted into a recess formed in the third jig 1150, the first waterproof member 1111 may be connected to the third waterproof member 1151 to prevent the bonding member from being introduced into the window and the display bracket.

As illustrated in FIG. 11E, if the first waterproof member 1111, the second waterproof member 1131, and the third waterproof member 1151 are connected to each other, the bonding member inserted (or injected) through the insertion hole 1133 is not introduced into the window and the display bracket but may be discharged to a discharge hole 1153.

Figure 12A:
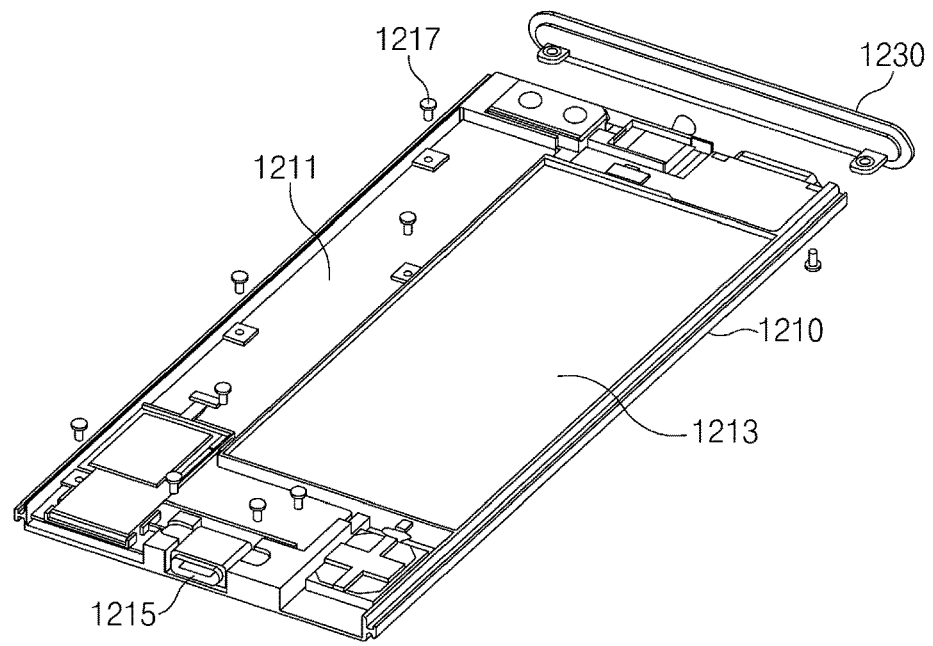
FIG. 12A is a view illustrating a process of coupling a hardware bracket and an upper end cover according to an embodiment of the present disclosure.
Figure 12A:
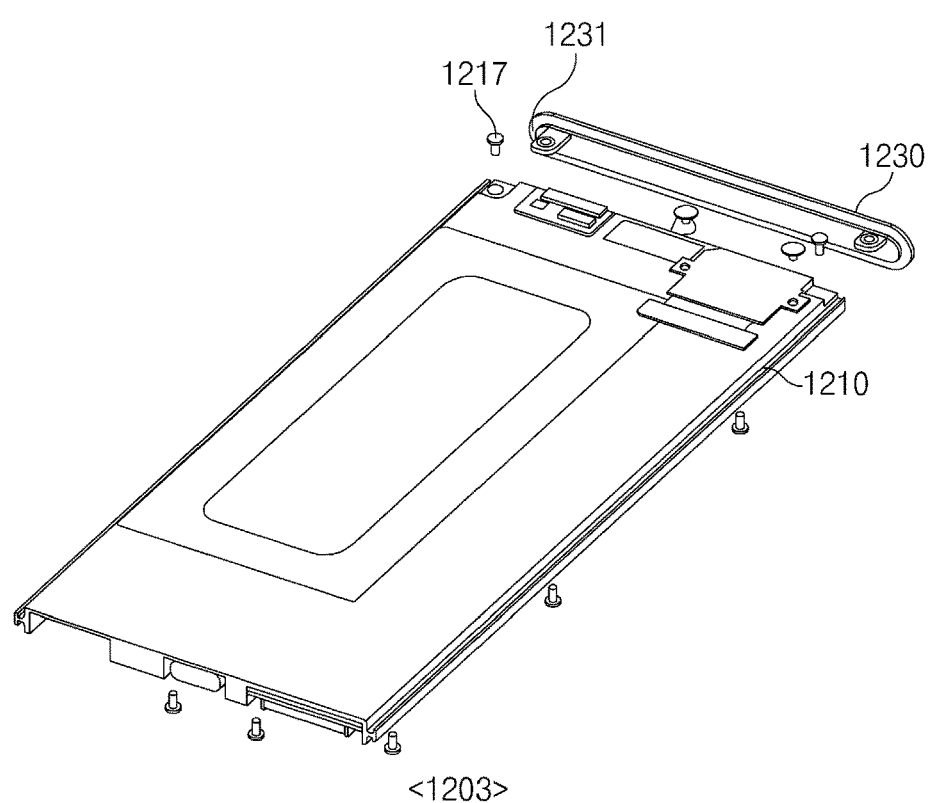
Figure 12B:
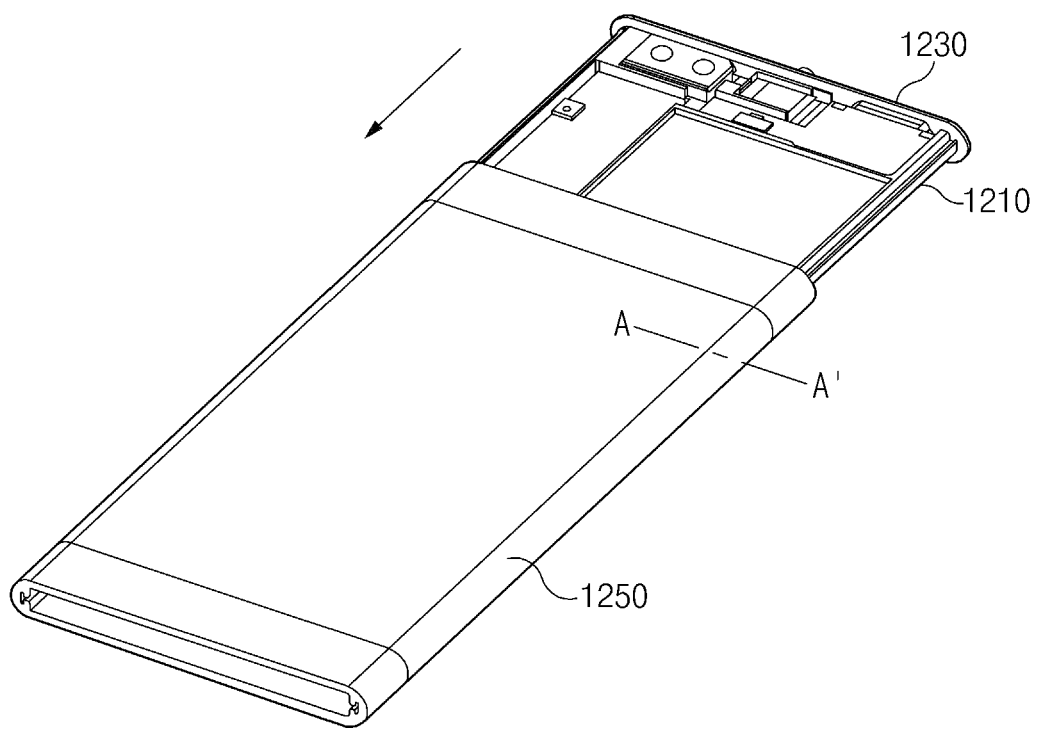
FIG. 12B is a view illustrating a process of inserting the hardware bracket, to which the upper end cover is coupled, into an enclosed window according to an embodiment of the present disclosure.
Figure 12C:
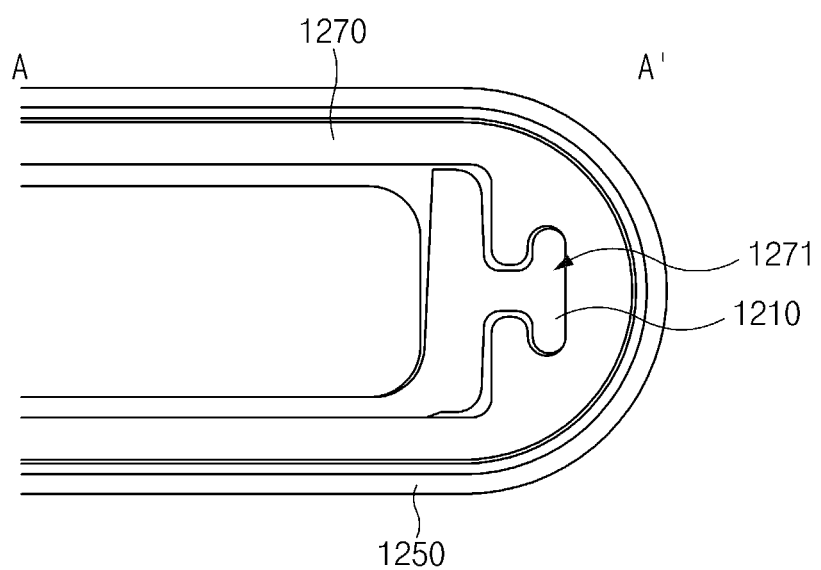
FIG. 12C is a sectional view taken along line A-A' of FIG. 12B according to an embodiment of the present disclosure.
Figure 12D:
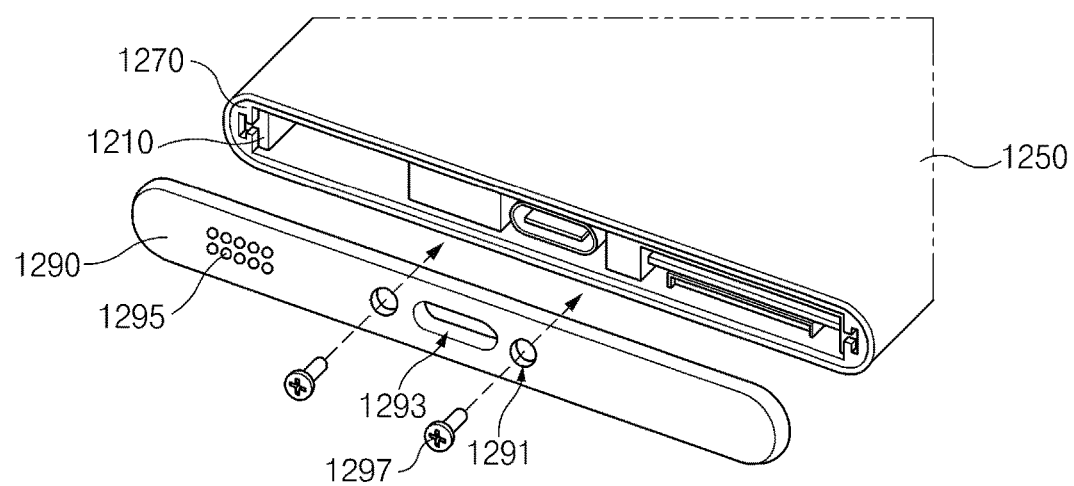
FIG. 12D is a view illustrating a process of coupling a lower end cover to the enclosed window, into which the hardware bracket is inserted according to an embodiment of the present disclosure.

FIG. 12A is a view illustrating a process of coupling a hardware bracket and an upper end cover according to an embodiment of the present disclosure, FIG. 12B is a view illustrating a process of inserting the hardware bracket, to which the upper end cover is coupled, into an enclosed window according to an embodiment of the present disclosure, FIG. 12C is a sectional view taken along line A-A' of FIG. 12B according to an embodiment of the present disclosure, and FIG. 12D is a view illustrating a process of coupling a lower end cover to the enclosed window, into which the hardware bracket is inserted according to an embodiment of the present disclosure. A first state 1201 of FIG. 12A corresponds to a front perspective view of a hardware bracket, and a second state 1203 of FIG. 12A is a rear perspective view of the hardware bracket.

Referring to FIG. 12A to 12D, if a window 1250 (e.g., the window 710 illustrated in FIGS. 7A and 7B) and a display bracket 1270 (e.g., the display bracket 810 illustrated in FIGS. 8A, 8B and 8C) are coupled to each other, a hardware bracket 1210 may be inserted into the display bracket 1270. According to an embodiment, various components may be seated on the hardware bracket 1210. For example, a printed circuit board 1211, a battery 1213, and an interface module 1215 may be seated on the hardware bracket 1210. As another example, at least one of the components may be fixed to the hardware bracket 1210 through a screw member 1217.

According to various embodiments, an upper end cover 1230 may be coupled to an upper surface of the hardware bracket 1210 before the hardware bracket 1210 is inserted into the window 1250, to which the display bracket 1270 is coupled. According to an embodiment, the upper end cover 1230 may include a screw hole 1231 on one side surface thereof, and may be coupled to the hardware bracket 1210 through the screw member 1217. However, the present disclosure is not limited thereto. According to various embodiments, the upper end cover 1230 may be coupled to the hardware bracket 1210 through interference-fitting. Further, before the hardware bracket 1210 is inserted into the window 1250, the lower end cover 1290 instead of the upper end cover 1230 may be coupled to a lower surface of the hardware bracket 1210 first.

If the upper end cover 1230 (or the lower end cover 1290) is coupled, the hardware bracket 1210 may be inserted into the window 1250. According to an embodiment, the hardware bracket 1210 may have a protrusion in an area of a side surface thereof. The protrusion may have a shape that protrudes from a side surface of the hardware bracket 1210, and may extend upwards and downwards along the side surface of the hardware bracket 1210 to have a specific length. According to an embodiment, when the hardware bracket 1210 is inserted into the window 1250, the protrusion may be engaged with a recess 1271 (e.g., the recess 413 illustrated in FIG. 4B) formed on an inner surface of the display bracket 1270 coupled to the window 1250 to be slidably inserted.

According to various embodiments, once the hardware bracket 1210 is inserted into the window 1250, the lower end cover 1290 (or the upper end cover 1230) may be coupled to a lower surface (or an upper surface) of the hardware bracket 1210. The drawing illustrates a state in which the lower end cover 1290 is coupled to a lower surface of the hardware bracket 1210. According to various embodiments, the lower end cover 1290 may be screw-coupled to the hardware bracket 1210. For example, the screw member 1297 may be inserted into the screw hole 1291 formed in the lower end cover 1290 to fix the lower end cover 1290 to the hardware bracket 1210. As another example, the lower end cover 1290 may further include at least one of an interfacing hole 1293 and a speaker hole 1295 (or a microphone hole).

According to various embodiments, the upper end cover 1230 may be coupled to an upper surface of the window 1250. Further, the lower end cover 1290 may be coupled to a lower surface of the window 1250.

As described above, according to various embodiments, an electronic device may include a substantially enclosed window including a front surface, a rear surface, and a side surface surrounding at least a portion of a space between the front surface and the rear surface, a display disposed inside the window, and a display bracket, to which the display is coupled and disposed inside the window. The display may be coupled to the window through curing of a bonding member inserted between the window and the display.

According to various embodiments, the window may be substantially cylindrical.

According to various embodiments, the electronic device may further include a printed film between the window and the display. The printed film may be coupled to the window through the curing of the bonding member.

According to various embodiments, the display may be attached to the display bracket to surround the display bracket.

According to various embodiments, the display bracket may be inserted into and disposed in a hollow provided inside the window such that the window and the display form a gap of a specific size.

According to various embodiments, the bonding member may be inserted into the gap.

According to various embodiments, the display may include a flexible printed circuit board. The flexible printed circuit board may be disposed to be folded towards one surface of the display before the display bracket is inserted into the window.

According to various embodiments, the electronic device may further include a hardware bracket disposed inside the display bracket. The hardware bracket may be slidably inserted into the display bracket.

According to various embodiments, the display bracket may include a recess extending towards upper and lower sides of the display bracket by a specific length along an inner surface of the display bracket. The hardware bracket may include a protrusion protruding from a side surface of the hardware bracket and extending towards upper and lower sides of the hardware bracket by a specific length along the side surface of the hardware bracket. The protrusion may be engaged with the recess such that the hardware bracket is slid to an inside of the display bracket.

According to various embodiments, the recess and the protrusion may have T shapes.

According to various embodiments, the electronic device may further include at least one cover coupled to an upper surface or a lower surface of at least one of the window and the hardware bracket.

According to various embodiments, the at least one cover may be screw-coupled to at least one of the window and the hardware bracket.

According to various embodiments, the bonding member may include an optically clear resin (OCR) or an optically clear adhesive (OCA).

Figure 13:
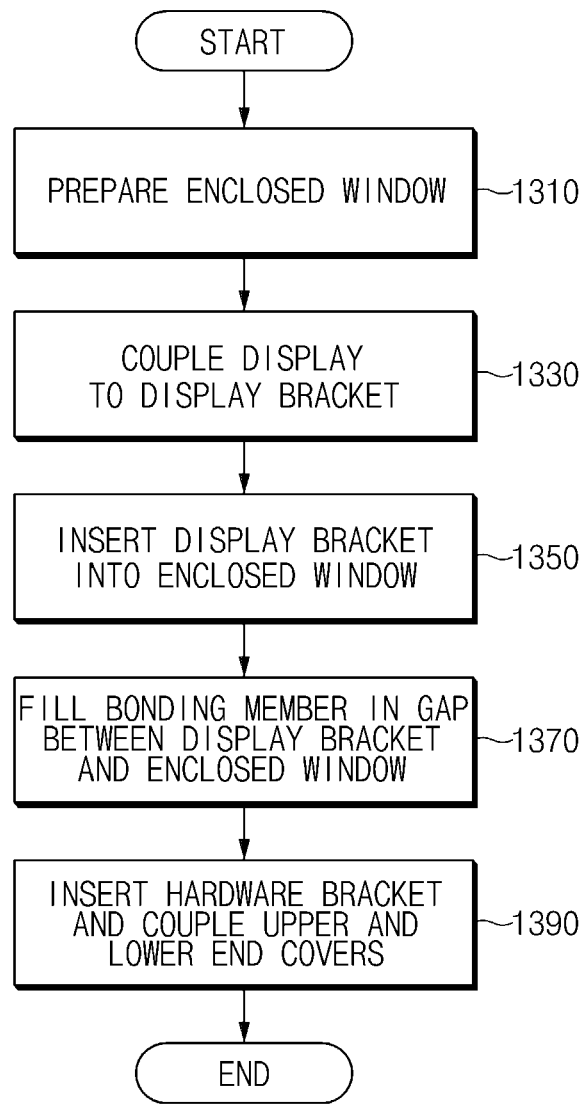
FIG. 13 is a view illustrating a process of manufacturing an electronic device including an enclosed window according to an embodiment of the present disclosure.

FIG. 13 is a view illustrating a process of manufacturing an electronic device including an enclosed window according to an embodiment of the present disclosure.

Referring to FIG. 13, in operation 1310, an enclosed window (e.g., the enclosed window 510 illustrated in FIGS. 5A and 5B) may be provided. As an example, an enclosed window including a front surface, a rear surface, and a side surface that surrounds at least a portion of a space between the front surface and the rear surface. An inside of the enclosed window 110, which is surrounded by the front surface, the rear surface, and the side surface of the window 110, may correspond to an empty space. Further, at least one of an upper surface and a lower surface of the enclosed window may not be formed or may include an opening. For example; the enclosed window may be provided such that at least one of the upper surface and the lower surface thereof is punched.

In operation 1330, a display (e.g., the display 570 illustrated in FIGS. 5A and 5B) may be coupled to a display bracket (e.g., the display bracket 530). According to an embodiment, the display may be attached to the display bracket. As an example, the display may be attached to the display bracket to surround the display bracket. When the display is attached to the display bracket, a bonding material may be applied to a specific area of a surface of the display, which the display bracket contacts, or a bonding layer may be disposed in the specific area. As another example, a printed film (e.g., the printed film 550) may be bonded to the display. As an example, the display and the printed film may be bonded through roll lamination. According to various embodiments, operation 1330 may be performed before operation 1310.

In operation 1350, the display bracket may be inserted into the enclosed window. The display bracket may be inserted into the enclosed window while forming a gap of a specific size. According to an embodiment, the enclosed window may be fixed to a first jig (e.g., the first jig 910 illustrated in FIGS. 9A and 9B) and the display bracket may be fixed to a second jig (e.g., the second jig 930) such that the display bracket may be inserted into the enclosed window while forming a gap of a specific size. For example, an upper part of the first jig and a lower part of the first jig may be fixed to surround the enclosed window. Further, the display bracket may be inserted into a cavity (e.g., the cavity 937) provided inside the second jig to be fixed. The first jig, to which the enclosed window is fixed, may be inserted into the second jig, to which the display bracket is fixed, while forming a gap (e.g., the gap 990) of a specific size.

A cavity (e.g., the cavity 937) may be provided inside the second jig such that the first jig may be inserted into the cavity. Further, the second jig may include an insertion hole (e.g., the insertion hole 931) that passes through one surface of the second jig. The insertion hole formed on one surface of the second jig may be connected to the cavity.

In operation 1370, a bonding member may be filled in a gap between the display bracket and the enclosed window. The bonding member may be filled in the gap between the display bracket and the enclosed window to couple the display bracket and the enclosed window. According to an embodiment, the bonding member may be inserted into the second jig through the insertion hole that passes through one surface of the second jig, and may be inserted into the gap between the display bracket and the enclosed window through the cavity connected to the insertion hole.

The bonding member, for example, may include an optically clear resin (OCR) or an optically clear adhesive (OCA). According to an embodiment, if the bonding member is inserted (or injected) into the gap, the bonding member may be cured as ultraviolet ray is irradiated to the enclosed window. If the bonding member is cured, the enclosed window and the display (or the printed film) attached to the display bracket may be coupled to each other.

In operation 1390, a hardware bracket (e.g. the hardware bracket 1210 illustrated in FIGS. 12A, 12B and 12C) may be inserted into the display bracket coupled to the enclosed window. Further, an upper end cover (e.g., the upper end cover 1230) may be coupled to an upper surface of the enclosed window, into which the hardware bracket is inserted, and a lower end cover (e.g., the lower end cover 1290) may be coupled to a lower surface of the enclosed window. However, a coupling sequence and a coupling location of the upper end cover and the lower end cover is not limited thereto. According to various embodiments, the upper end cover may be coupled to the enclosed window first before the hardware bracket is inserted into the display bracket. Further, the lower end cover may be coupled to the enclosed window first before the upper end cover is coupled to the enclosed window. At least one of the upper end cover and the lower end cover may be screw-coupled to the enclosed window. At least one of the upper end cover and the lower end cover may be coupled to the hardware bracket. As an example, the upper end cover may be screw-coupled to the upper surface of the hardware bracket. As an example, the lower end cover may be screw-coupled to the lower surface of the hardware bracket.

As described above, according to various embodiments, a method for manufacturing an electronic device may include preparing a substantially enclosed window including a front surface, a rear surface, and a side surface surrounding at least a portion of a space between the front surface and the rear surface, coupling a display to a display bracket, inserting the display bracket into the window, filling a bonding member between the display bracket and the window, inserting a hardware bracket into the display bracket, and coupling at least one cover to an upper surface or a lower surface of at least one of the window and the hardware bracket.

According to various embodiments, the coupling of the display may include attaching the display to the display bracket such that the display surrounds the display bracket.

According to various embodiments, the inserting of the display bracket may include inserting the display bracket into a hollow provided inside the window such that the window and the display form a gap of a specific size.

According to various embodiments, the filling of the bonding member may include inserting the bonding member into the gap.

According to various embodiments, the method may further include UV curing the filled bonding member.

According to various embodiments, the inserting of the hardware bracket may include sliding the hardware bracket into the display bracket such that the hardware bracket is inserted into the display bracket while a protrusion protruding from a side surface of the hardware bracket and extending towards upper and lower sides of the hardware bracket by a specific length along the side surface of the hardware bracket is engaged with a recess extending towards upper and lower sides of the display bracket by a specific length along an inner surface of the display bracket.

According to various embodiments, the coupling of the at least one cover may include screw-coupling at least one of the window and the hardware bracket and the at least one cover.

According to various embodiments of the present disclosure, the display may be uniformly coupled to the inside of the window by attaching the display to the display bracket to assemble the enclosed window.

In addition, the present disclosure may provide various effects that are directly or indirectly recognized.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor, the processor may perform functions corresponding to the instructions. The computer-readable storage medium may be, for example, the memory.

A computer-readable recording medium may include a hard disk, a floppy disk, a magnetic medium (e.g., a magnetic tape), an optical medium (e.g., compact disc-read only memory (CD-ROM), or digital versatile disc (DVD)), a magneto-optical medium (e.g., a floptical disk), or a hardware device (e.g., a ROM, a random-access memory (RAM), a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to various embodiments thereof, it will be understood by those skilled in the art that various changes in form and details may be made therein without departing from the spirit and scope of the present disclosure, as defined by the appended claims and their equivalents.

What is claimed is:

1. An electronic device comprising:
a window comprising a first area defining a front surface of the electronic device, a second area defining a rear surface of the electronic device, and a third area extending from the first area to the second area;
a display disposed inside the window and extending to at least a portion of each of the first area, the second area, and the third area;
a display bracket coupled to the display and disposed inside the window; and a bonding member formed between the display and the window.

2. The electronic device of claim 1, wherein the window is substantially cylindrical.

3. The electronic device of claim 1, further comprising:
a printed film positioned between the window and the display, wherein the printed film is coupled to the window by the curing of the bonding member.

4. The electronic device of claim 1, wherein the display is configured to be attached to the display bracket and surround the display bracket.

5. The electronic device of claim 1, wherein the display bracket is configured to be inserted into and disposed in a hollow space provided inside the window such that the window and the display form a gap therebetween of a specific size.

6. The electronic device of claim 5, wherein the bonding member is configured to be inserted into the gap.

7. The electronic device of claim 5,
wherein the display comprises a flexible printed circuit board, and
wherein at least part of the flexible printed circuit board is configured to be folded into the hollow space.

8. The electronic device of claim 1, further comprising:
a hardware bracket disposed inside the display bracket, wherein the hardware bracket is configured to be slidably inserted into the display bracket.

9. The electronic device of claim 8,
wherein the display bracket comprises a recess extending towards upper and lower sides of the display bracket by a first specific length along an inner surface of the display bracket,
wherein the hardware bracket comprises a protrusion protruding from a side surface of the hardware bracket and extending towards upper and lower sides of the hardware bracket by a second specific length along the side surface of the hardware bracket, and
wherein the protrusion is configured to engage the recess such that the hardware bracket is slidable relative to the display bracket.

10. The electronic device of claim 9, wherein the recess and the protrusion comprise T shapes.

11. The electronic device of claim 8, further comprising:
at least one cover coupled to an upper surface or a lower surface of at least one of the window and the hardware bracket.

12. The electronic device of claim 11, wherein the at least one cover is screw-coupled to at least one of the window and the hardware bracket.

13. The electronic device of claim 1, wherein the bonding member comprises at least one of an optically clear resin or an optically clear adhesive.

* * * * *